United States Patent
Yamagishi et al.

(10) Patent No.: US 9,971,860 B2
(45) Date of Patent: May 15, 2018

(54) ALLOCATING PLURALITY OF RAMS TO FPGA BLOCK RAM

(71) Applicant: FUJITSU LIMITED, Kawasaki-shi, Kanagawa (JP)

(72) Inventors: Sei Yamagishi, Hachiouji (JP); Masataka Mine, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/082,277

(22) Filed: Mar. 28, 2016

(65) Prior Publication Data

US 2016/0292337 A1 Oct. 6, 2016

(30) Foreign Application Priority Data

Apr. 1, 2015 (JP) ................. 2015-074988

(51) Int. Cl.
*G06F 17/50* (2006.01)
(52) U.S. Cl.
CPC ........ *G06F 17/5054* (2013.01); *G06F 17/505* (2013.01)
(58) Field of Classification Search
CPC .................. G06F 17/5054; G06F 17/505
See application file for complete search history.

(56) References Cited

U.S. PATENT DOCUMENTS

| | | | | |
|---|---|---|---|---|
| 4,954,951 A | * | 9/1990 | Hyatt | .................. B60R 16/0373 711/218 |
| 5,339,268 A | * | 8/1994 | Machida | ................ G11C 15/00 365/189.05 |
| 7,805,688 B2 | * | 9/2010 | Yamakawa | ........... G06F 17/505 716/117 |
| 8,315,158 B2 | * | 11/2012 | Goose | ................... H04L 12/413 370/222 |
| 9,081,501 B2 | * | 7/2015 | Asaad | ...................... G06F 15/76 |
| 9,256,369 B2 | * | 2/2016 | Nazm Bojnordi | .... G06F 3/0611 |
| 2004/0117527 A1 | | 6/2004 | Takata | |
| 2007/0180213 A1 | | 8/2007 | Yamakawa et al. | |

FOREIGN PATENT DOCUMENTS

| | | |
|---|---|---|
| JP | 2000-207274 | 7/2000 |
| JP | 2004-178056 | 6/2004 |
| JP | 2007-207042 | 8/2007 |

* cited by examiner

*Primary Examiner* — Naum B Levin
(74) *Attorney, Agent, or Firm* — Fujitsu Patent Center

(57) ABSTRACT

A design apparatus includes a processing unit configured to allocate a plurality of RAMs to a FPGA block RAM in at least one of a word direction and a bit direction thereof, and to generate a description, in a hardware description language, of a control circuit that controls input and output signals of each of the plurality of RAMs so as to allow each of the plurality of RAMs to be accessed as a single RAM.

9 Claims, 23 Drawing Sheets

FIG.19

| SIGNAL NAME | bit | I/O | P/N | DESCRIPTION | NOTE |
|---|---|---|---|---|---|
| XRST | - | I | N | SYSTEM RESET | |
| CLK | - | I | P | SYSTEM CLOCK | |
| EN1 | - | I | P | RAM1 ACCESS ENABLE | |
| AD1 | 5:0 | I | P | RAM1 ADDRESS DATA | |
| DI1 | 7:0 | I | P | RAM1 WRITE DATA | |
| RW1 | - | I | P | RAM1 WRITE ENABLE | |
| EN2 | - | I | P | RAM2 ACCESS ENABLE | |
| AD2 | 7:0 | I | P | RAM2 ADDRESS DATA | |
| DI2 | 19:0 | I | P | RAM2 WRITE DATA | |
| RW2 | - | I | P | RAM2 WRITE ENABLE | |
| EN3 | - | I | P | RAM3 ACCESS ENABLE | |
| AD3 | 8:0 | I | P | RAM3 ADDRESS DATA | |
| DI3 | 15:0 | I | P | RAM3 WRITE DATA | |
| RW3 | - | I | P | RAM3 WRITE ENABLE | |
| DO1 | 7:0 | O | P | RAM1 READ DATA | |
| VAL1 | - | O | P | RAM1 VALID SIGNAL | NEGATE DURING RAM OPERATION |
| DO2 | 19:0 | O | P | RAM2 READ DATA | |
| VAL2 | - | O | P | RAM2 VALID SIGNAL | NEGATE DURING RAM OPERATION |
| DO3 | 15:0 | O | P | RAM3 READ DATA | |
| VAL3 | - | O | P | RAM3 VALID SIGNAL | NEGATE DURING RAM OPERATION |

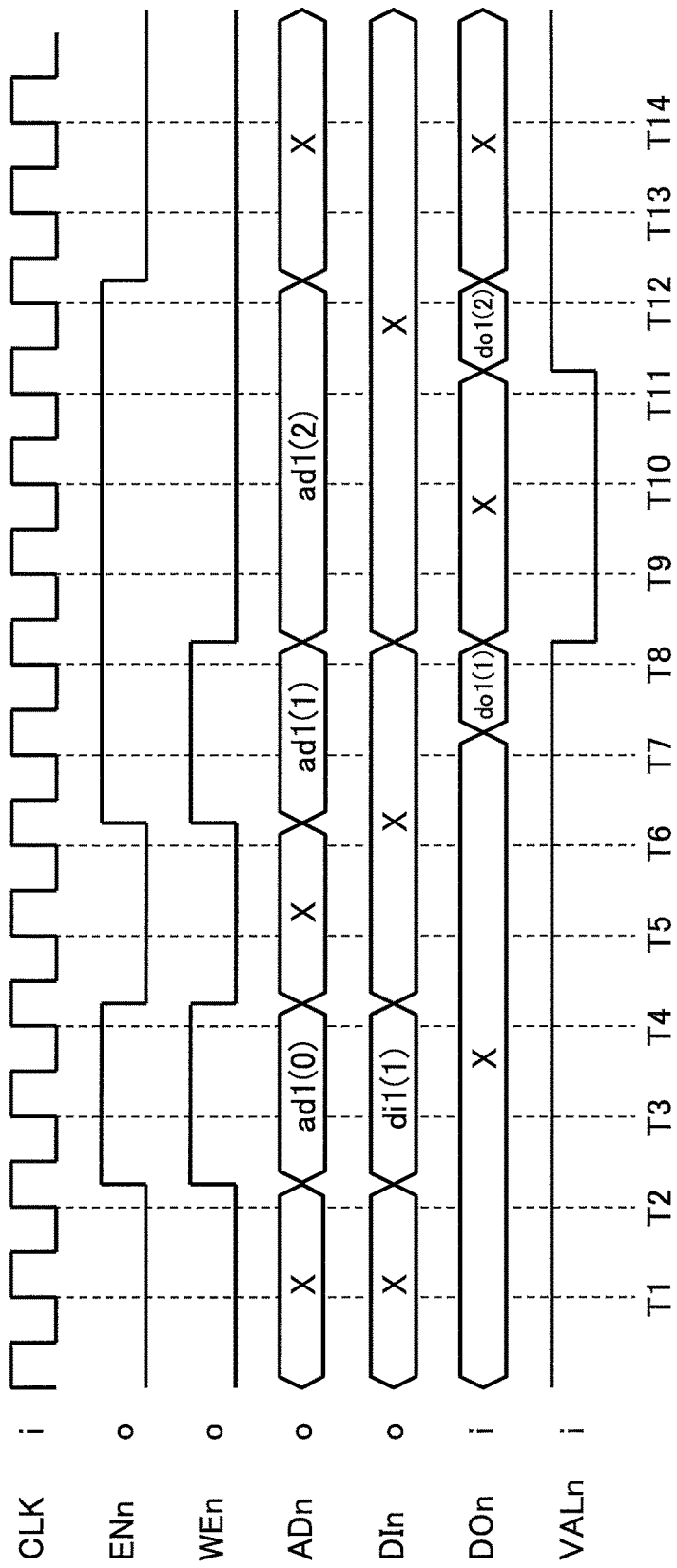

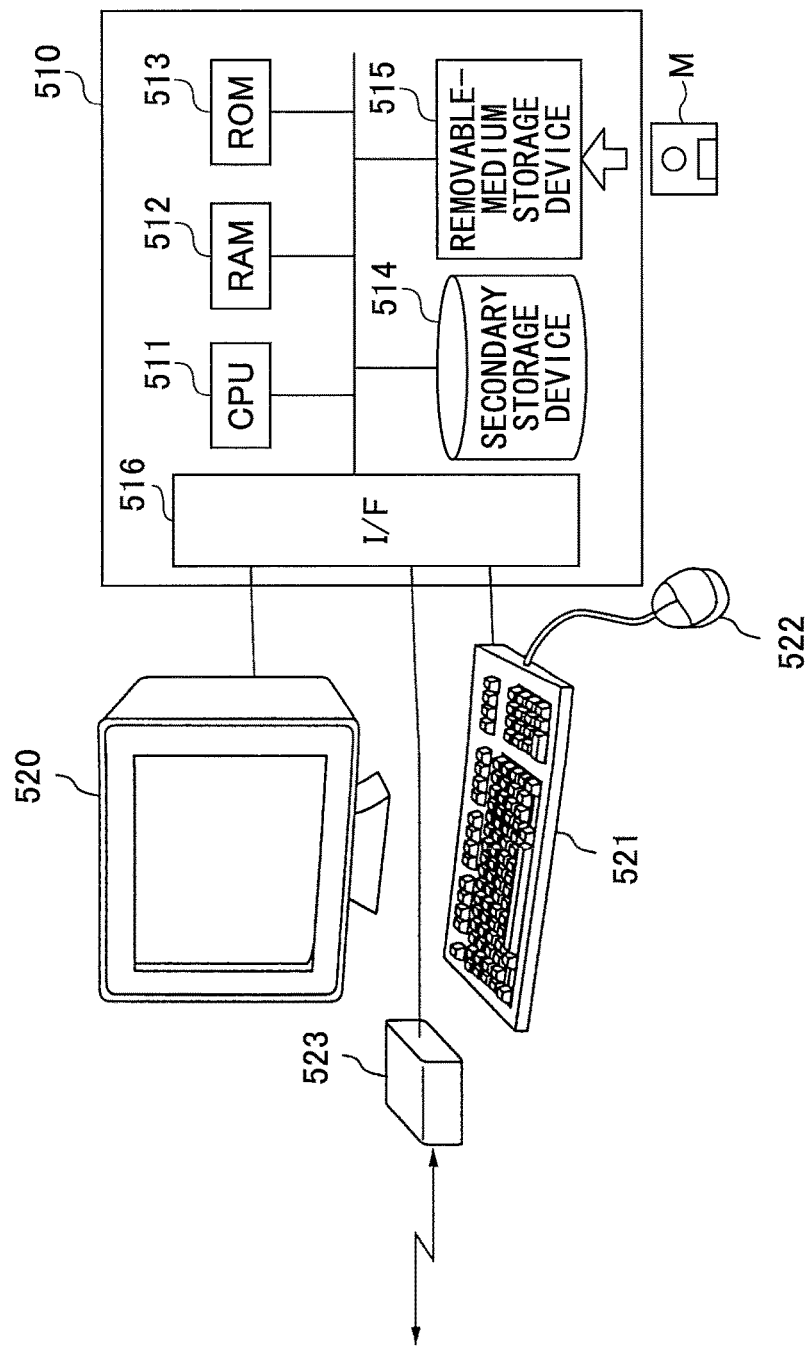

US 9,971,860 B2

ALLOCATING PLURALITY OF RAMS TO FPGA BLOCK RAM

CROSS-REFERENCE TO RELATED APPLICATIONS

The present application is based upon and claims the benefit of priority from the prior Japanese Patent Application No. 2015-074988 filed on Apr. 1, 2015, with the Japanese Patent Office, the entire contents of which are incorporated herein by reference.

FIELD

The disclosures herein relate to a design apparatus, a computer-readable medium, and a FPGA-based design method.

BACKGROUND

In FPGA-based development and implementation, the development cost is largely dependent on the price of the FPGA device on which a designed circuit is implemented. The price of an FPGA varies depending on the FPGA device vender and the circuit size. A large-scale FPGA utilizing a state-of-art technology tends to be very expensive. A designer taking part in the FPGA-based development process makes every effort such as to use a prior-generation FPGA device or a small-scale FPGA device for the purpose of reducing cost as much as possible. Because of this, a circuit design process requires the utilization of FPGA resources to the maximum extent.

An FPGA circuit design process typically utilizes an RTL (register transfer level)-based design that is independent of the choice of technology and the choice of a vendor. Circuit portions other than the RAM (random access memory) can be efficiently implemented on an FPGA through CAD (computer aided design)-based optimization and the like.

An FPGA device has RAMs (i.e., block RAMs) implemented therein, a number of which is specific to each FPGA device. Implementation of a given circuit design may require a larger number of RAMs than the number of block RAMs provided in the FPGA device to be used. To cope with such a situation, a higher-grade FPGA device having a larger number of block RAMs may be used, or external RAMs may be additionally used. The use of a higher-grade FPGA device, however, directly leads to a cost increase. Further, the use of an external RAM may require changes in the RTL design and in the printed circuit board, resulting in an increase in the development cost.

[Patent Document 1] Japanese Laid-open Patent Publication No. 2007-207042
[Patent Document 2] Japanese Laid-open Patent Publication No. 2000-207274
[Patent Document 3] Japanese Laid-open Patent Publication No. 2004-178056

SUMMARY

According to an aspect of the embodiment, a design apparatus includes a processing unit configured to allocate a plurality of RAMs to a FPGA block RAM in at least one of a word direction and a bit direction thereof, and to generate a description, in a hardware description language, of a control circuit that controls input and output signals of each of the plurality of RAMs so as to allow each of the plurality of RAMs to be accessed as a single RAM.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 19 is a table illustrating the input and output signals of the logic RAM model illustrated in FIG. 8.

FIG. 26 is a timing chart illustrating an example of the operation of the user circuit accessing a multi-mapping RAM; and FIG. 27 is a drawing illustrating an example of the configuration of a design apparatus.

DESCRIPTION OF EMBODIMENTS

In the following, embodiments of the invention will be described with reference to the accompanying drawings. In these drawings, the same or corresponding elements are referred to by the same or corresponding numerals, and a description thereof will be omitted as appropriate.

Figure 1:
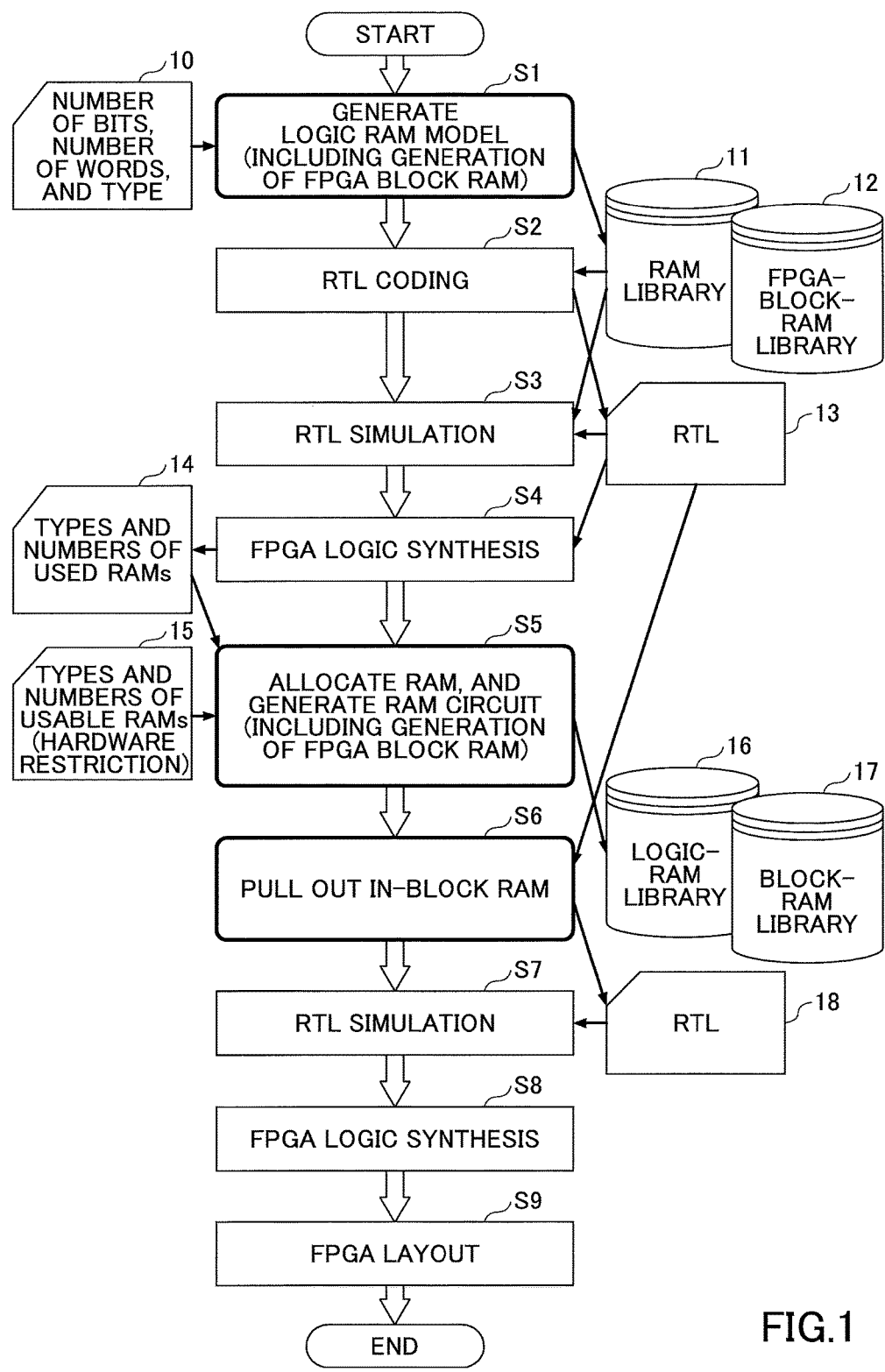
FIG. 1 is a flowchart illustrating an example of an FPGA-based development procedure.

FIG. 1 is a flowchart illustrating an example of an FPGA-based development procedure. It may be noted that, in FIG. 1 and the subsequent flowcharts, an order in which the steps illustrated in the flowchart are performed is only an example. The scope of the disclosed technology is not limited to the disclosed order. For example, a description may explain that an A step is performed before a B step is performed. Despite such a description, it may be physically and logically possible to perform the B step before the A step while it is possible to perform the A step before the B step. In such a case, all the consequences that affect the outcomes of the flowchart may be the same regardless of which step is performed first. It then follows that, for the purposes of the disclosed technology, it is apparent that the B step can be performed before the A step is performed. Despite the explanation that the A step is performed before the B step, such a description is not intended to place the obvious case as described above outside the scope of the disclosed technology. Such an obvious case inevitably falls within the scope of the technology intended by this disclosure.

A design apparatus such as a CAD (computer aided design) apparatus performs the process of each step of the FPGA-based development procedure illustrated in FIG. 1. In step S1, the design apparatus generates a logic RAM model as a RAM library 11. Namely, based on RAM information 10 that specifies the number of bits, the number of words, and a memory type (e.g., an indication of a type such as a dual port or a single port), the design apparatus arranges for block RAMs of the FPGA to be used as RAMs having desired numbers of bits and words as well as desired memory types.

Figure 2:
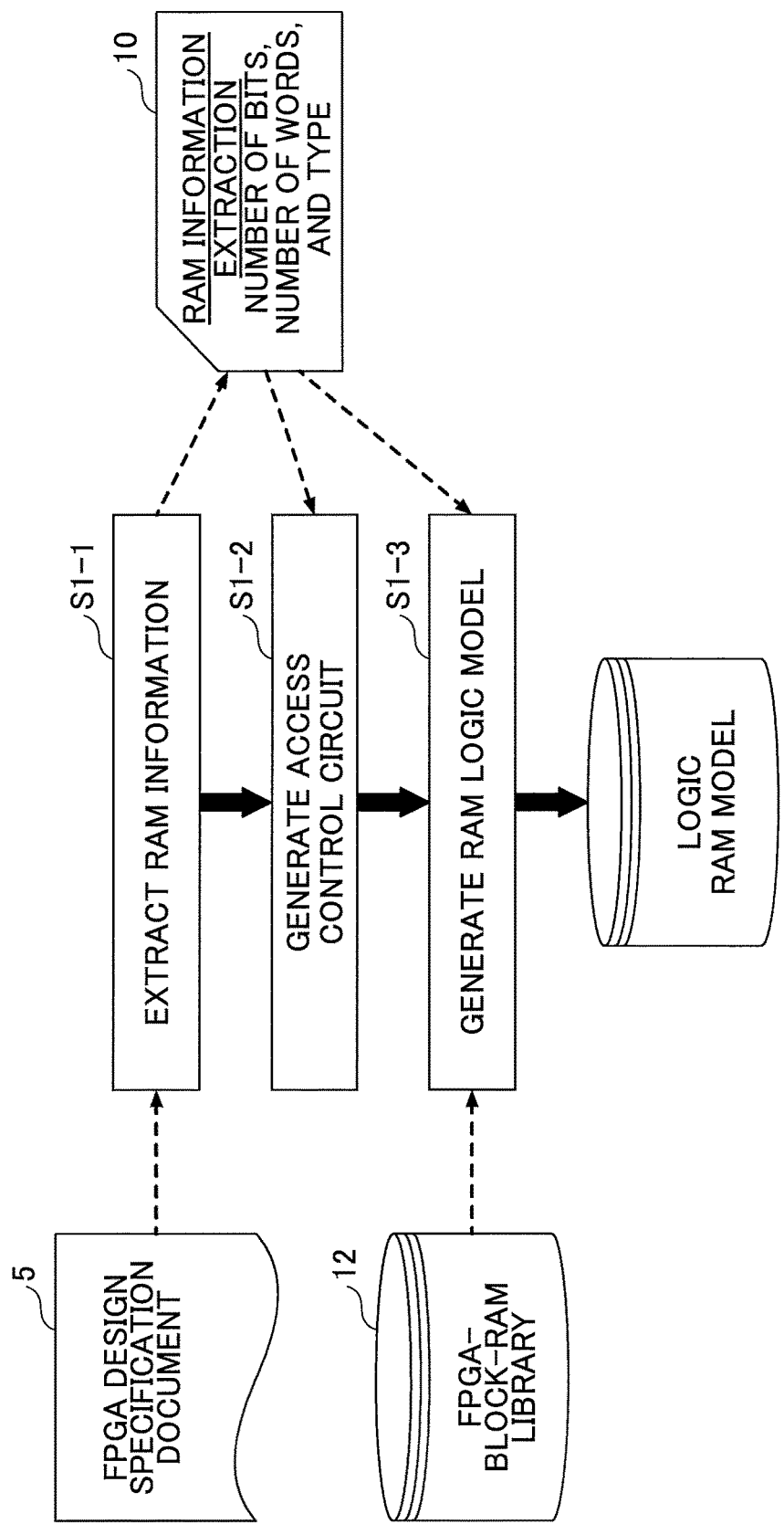
FIG. 2 is a flowchart illustrating the process of generating logic RAM models.

FIG. 2 is a flowchart illustrating the process of generating logic RAM models. In step S1-1, the RAM information 10 is extracted from an FPGA design specification document 5 that specifies the specification of a circuit that is to be developed on an FPGA. In step S1-2, the design apparatus generates access control circuits that enable the use of block RAMs of the FPGA as RAMs having specific numbers of bits and words as well as memory types as specified in the RAM information 10. Namely, the design apparatus generates the descriptions of the access control circuits in a hardware description language. In step S1-3, the design apparatus combines an FPGA-block-RAM library 12 with the access control circuits to generates logic RAM models as RTL descriptions.

Figure 3:
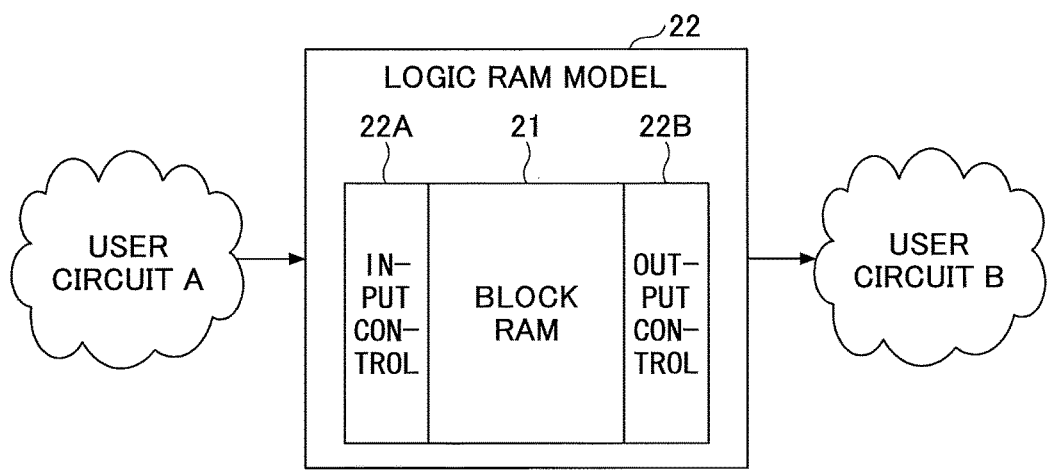
FIG. 3 is a drawing illustrating an example of the configuration of a logic RAM model.

FIG. 3 is a drawing illustrating an example of the configuration of a logic RAM model. As illustrated in FIG. 3, a logic RAM model 22 includes a block RAM 21, an input control circuit 22A, and an output control circuit 22B. The block RAM 21 allows the data-bit width and the address-bit width thereof to be variably set. The provision of the input control circuit 22A and the output control circuit 22B enables the use of the block RAM 21 as a RAM having the desired width of data bits and the desired width of address bits. The input control circuit 22A supplies an input address and write data from a user circuit A to the block RAM 21. The output control circuit 22B supplies read data from the block RAM 21 to a user circuit B.

By referring to FIG. 1 again, the design apparatus performs RTL coding in step S2. Namely, the design apparatus incorporates the RTL descriptions of the logic RAM models generated in step S1 into the RTL description of the circuit under design. By doing so, the design apparatus generates an RTL description 13. In step S3, the design apparatus uses a simulator to check whether the circuit specified by the RTL description 13 performs operations conforming to the specification. The design apparatus repeatedly performs the modification and simulation of the RTL description 13 as needed, thereby generating an appropriate RTL description 13.

In step S4, the design apparatus performs the logic synthesis of the FPGA based on the RTL description 13. Namely, the contents of the RTL description 13 are allocated to the resources of the FPGA device. At this time, the types and number of RAMs used in the RTL description 13 are identified and obtained as RAM-use information 14. In the case in which the number of block RAMs provided in the FPGA device is smaller than the number of RAMs used in the RTL description 13, the FPGA logic synthesis fails, producing an error message. In the case in which the number of block RAMs provided in the FPGA device is larger than or equal to the number of RAMs used in the RTL description 13, the FPGA logic synthesis succeeds. After this, the circuit may be laid out (i.e., placement and routing may be performed) on the FPGA.

When the error message is produced upon the failure of the FPGA logic synthesis, the design apparatus allocates a plurality of RAMs to a single FPGA block RAM in step S5. Specifically, the design apparatus allocates a plurality of RAMs to a single FPGA block RAM in at least one of the word direction and the bit direction based on the RAM-use information 14 and hardware restriction information that indicates the types and number of RAMs usable on the FPGA. Further, the design apparatus generates a control circuit as a description in the hardware description language for controlling the input and output signals of the plurality of RAMs allocated to a single FPGA block RAM in order to allow each of the plurality of RAMs to be accessed as a single RAM. These processes serve to generate a logic-RAM library 16 and a block-RAM library 17 with respect to each RAM for which multiple mapping (i.e., multiple allocation) has been performed. Such processes will later be described in detail.

In step S6, the design apparatus performs, with respect to logic blocks (i.e., logic modules) in the circuit under design, a pull-out process for the RAMs for which multiple mapping has been performed. Specifically, the design apparatus identifies signals coupled to the RAMs each arranged as a single RAM in the description of the circuit under design in the hardware description language, followed by reconnecting the identified signals to the control circuit of a single FPGA block RAM. This generates an RTL description 18 including RAMs for which multiple mapping has been performed.

Figure 4:
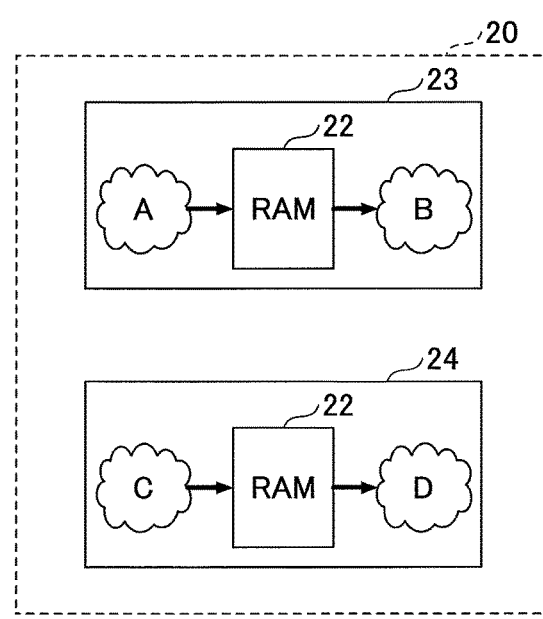
FIG. 4 is a schematic drawing illustrating an example of the relationship between a RAM and a logic module of a circuit under design.

FIG. 4 is a schematic drawing illustrating an example of the relationship between a RAM and a logic module of a circuit under design. In the example illustrated in FIG. 4, a circuit 20 under design includes a logic module 23 and a logic module 24. The logic module 23 includes a user circuit A, a logic RAM model 22, and a user circuit B. The logic module 24 includes a user circuit C, a logic RAM model 22, and a user circuit D. In this state, each of the RAMs 22 is disposed in a respective module as a single RAM.

Figure 5:
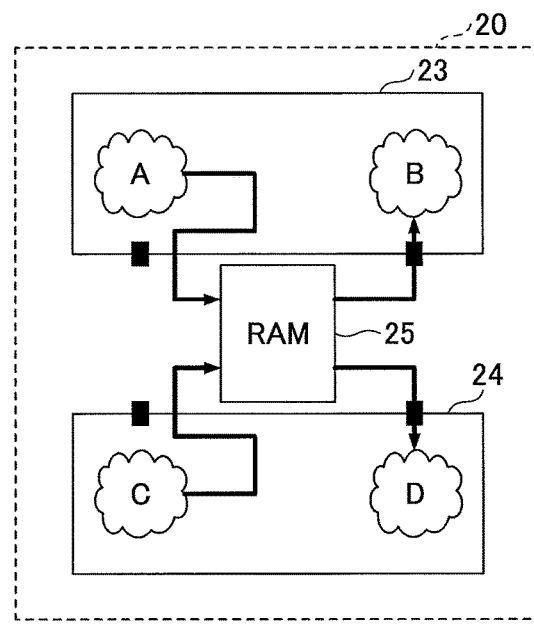
FIG. 5 is a schematic drawing illustrating an example of the relationship between logic modules and a RAM subjected to multiple mapping.

FIG. 5 is a schematic drawing illustrating an example of the relationship between logic modules and a RAM subjected to multiple mapping. In the example illustrated in FIG. 5, the circuit 20 under design includes the logic module 23 and the logic module 24. The logic module 23 includes the user circuit A and the user circuit B, but does not include a logic RAM model. The logic module 24 includes the user circuit C and the user circuit D, but does not include a logic RAM model. A logic RAM model 25 that is a single block RAM having two RAMs allocated thereto is disposed outside the logic modules 23 and 24. The output signal of the user circuit A and the input signal of the user circuit B are pull out from the logic module 23 for connection to the logic RAM model 25. The output signal of the user circuit C and the input signal of the user circuit D are pull out from the logic module 24 for connection to the logic RAM model 25.

Figure 6:
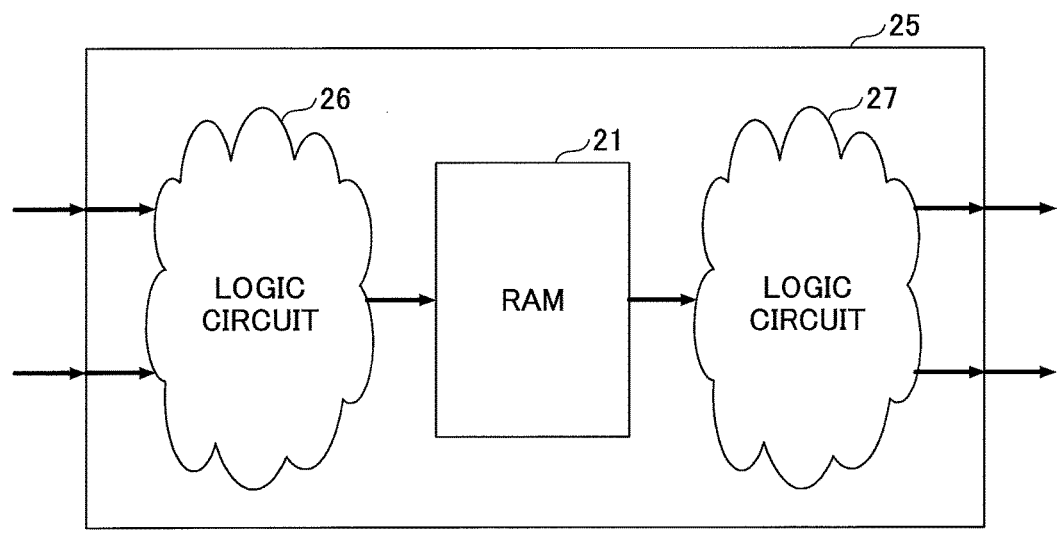
FIG. 6 is a drawing illustrating an example of the configuration of the logic RAM model.

FIG. 6 is a drawing illustrating an example of the configuration of the logic RAM model 25. The logic RAM model 25 includes the block RAM 21 having a plurality of RAMs allocated thereto, a logic circuit 26, and a logic circuit 27. Each of the logic circuits 26 and 27 is a control circuit that controls the input or output signals of each of the RAMs allocated to the single block RAM 21 so as to allow each RAM to be accessed as a single RAM. The input signals of the logic circuit 26 are the output signals of the user circuits A and C illustrated in FIG. 5. The logic circuit 26 generates signals for accessing the block RAM 21 based on the received input signals. The logic circuit 27 receives signals from the block RAM 21 as input signals, and generates output signals based on the received input signals. The output signals of the logic circuit 27 serve as the input signals into the user circuits B and D illustrated in FIG. 5.

As illustrated in FIG. 4 through FIG. 6, signals connected to the RAMs (i.e., the logic RAM models 22 illustrated in FIG. 4) each disposed as a single RAM in the circuit 20 under design are identified, and, then, the identified signals are reconnected to the logic RAM model 25. In so doing, these identified signals are coupled to the control circuits (i.e., logic circuits 26 and 27) of the block RAM 21 that are embedded in the logic RAM model 25.

Referring to FIG. 1 again, in step S7, the design apparatus uses a simulator to check whether the circuit specified by the RTL description 18 performs operations conforming to the specification. The design apparatus repeatedly performs the modification and simulation of the RTL description 18 as needed, thereby generating an appropriate RTL description 18.

In step S8, the design apparatus performs the logic synthesis of the FPGA based on the RTL description 18. Namely, the contents of the RTL description 18 are allocated to the resources of the FPGA device. In step S9, the design apparatus lays out the circuit (i.e., performs placement and routing) on the FPGA. It may be noted that timing verification may be performed as needed in order to check whether the circuit operates at desired speed. With this, the procedure for FPGA-based development comes to an end.

Figure 7:
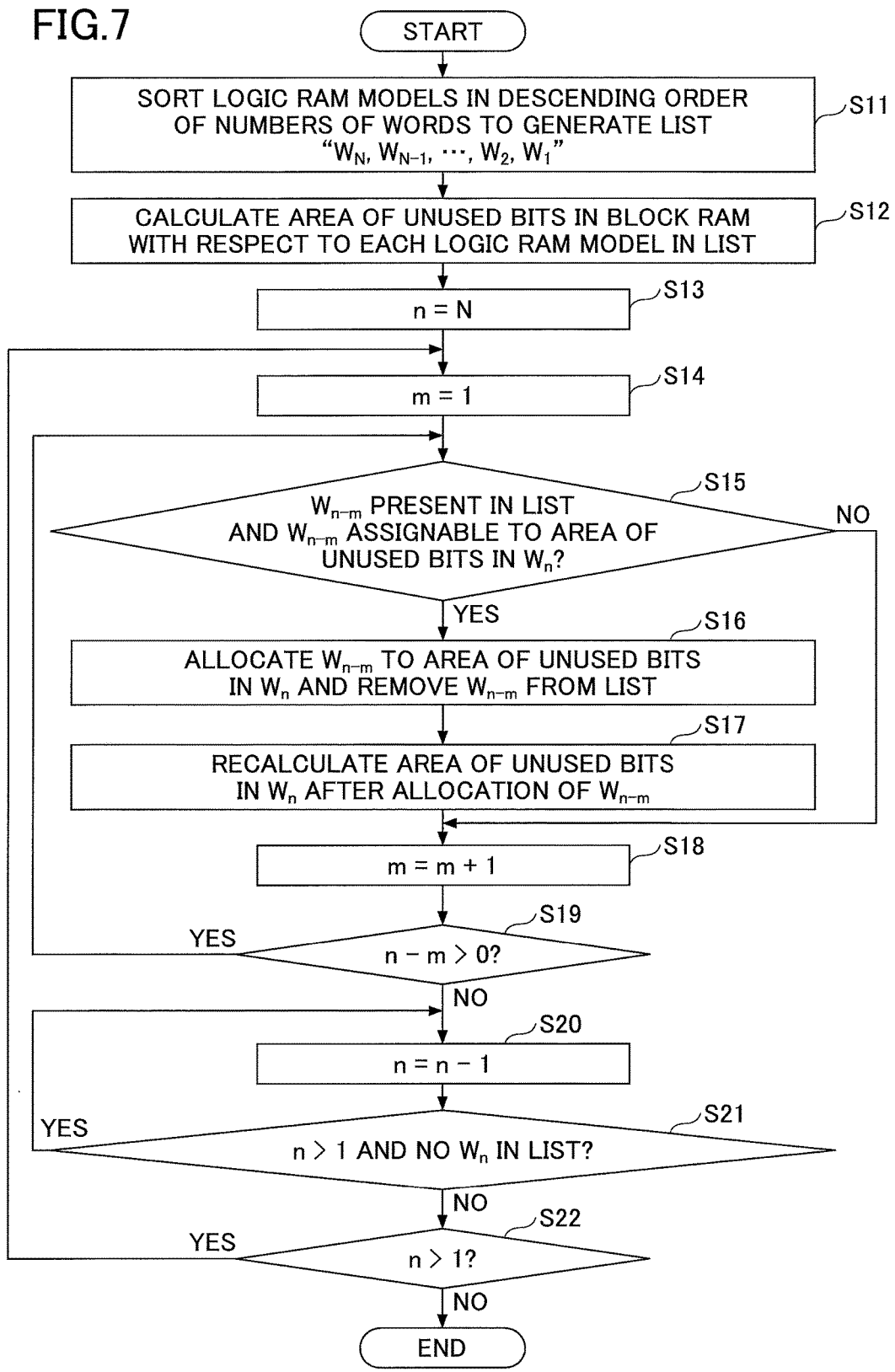
FIG. 7 is a flowchart illustrating an example of the procedure for allocating RAMs.

FIG. 7 is a flowchart illustrating an example of the procedure for allocating RAMs. The procedure illustrated in FIG. 7 is performed in step S5 of FIG. 1. Each step illustrated in FIG. 7 may be automatically performed by the design apparatus.

In step S11, the logic RAM models generated in step S1 of FIG. 1 are sorted in the descending order of the number of words, thereby producing a list in which the logic RAM models are arranged in the descending order of the number of words. This list is denoted as "$W_N, W_{N-1}, \ldots, W_2, W_1$".

In step S12, the size of the area of unused bits in a block RAM is calculated with respect to each logic RAM model in the list.

Figure 8:
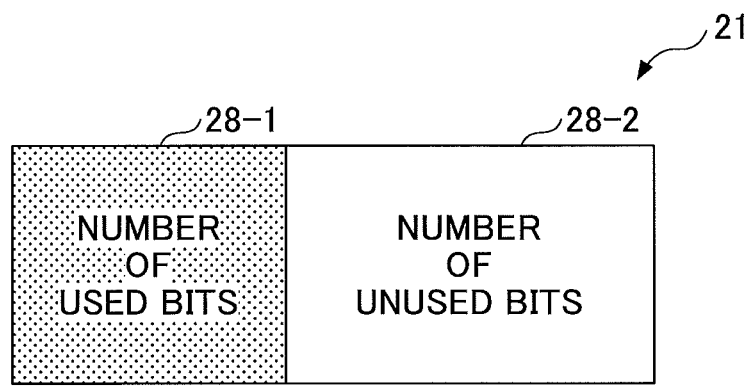
FIG. 8 is a drawing illustrating the area of unused bits in a block RAM.

FIG. 8 is a drawing illustrating the area of unused bits in a block RAM. In FIG. 8 and similar subsequent drawings, the vertical direction in the figure corresponds to the direction in which a plurality of word lines are arranged one after another (i.e., the direction in which the bit lines extend), and the horizontal direction in the figure corresponds to the direction in which a plurality of bits lines are arranged one after another (i.e., the direction in which the word lines extend). The single block RAM 21 has a single RAM 28-1 allocated thereto. The number of bits in a remaining area 28-2 is referred to as the number of bits of the area of unused bits.

By referring to FIG. 7 again, in step S13, the total number N of logical RAM models in the list is assigned to variable n. In step S14, variable m is set to 1. In step S15, a check is made as to whether the following condition is satisfied: $W_{n-m}$ is present in the list and $W_{n-m}$ is assignable to the area of unused bits in $W_n$. In the case of the above-noted condition being satisfied, the procedure proceeds to step S16. In the case of the above-noted condition being not satisfied, the procedure proceeds to step S18. In step S16, $W_{n-m}$ is assigned to the area of unused bits in $W_n$, followed by removing $W_{n-m}$ from the list.

Figure 9:
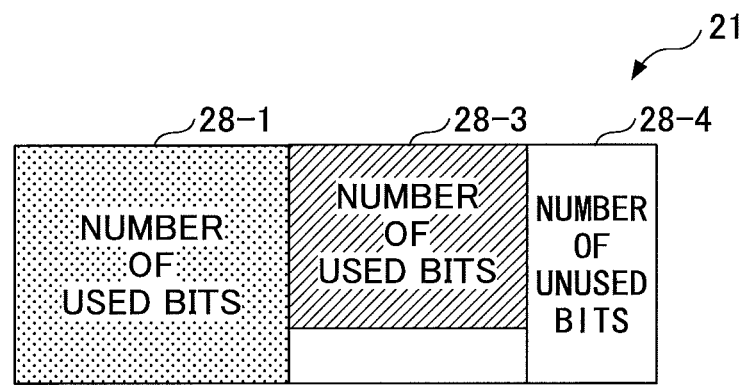
FIG. 9 is a drawing illustrating the allocation of a RAM to the area of unused words in a block RAM.

FIG. 9 is a drawing illustrating the allocation of a RAM to the area of unused bits in a block RAM. The single block RAM 21 has two RAMs 28-1 and 28-3 allocated thereto. The number of bits in a remaining area 28-4 is referred to as the number of bits of the area of unused bits. The RAM 28-1 is the RAM ($W_n$) that has been in existence from the initial state, and the RAM 28-3 is the RAM (W) that has been subsequently added. As was previously noted, the items in the list "$W_N, W_{N-1}, \ldots, W_2, W_1$" are arranged in the descending order of the number of words. Accordingly, the number of words in $W_{n-m}$ is smaller than the number of words in $W_n$, and the RAM 28-3 has a shorter width in the vertical direction than the RAM 28-1 in FIG. 9.

By referring to FIG. 7 gain, in step S17, the size of the area of unused bits in $W_n$ upon the allocation of $W_{n-m}$ is recalculated. In the example illustrated in FIG. 9, for example, the number of bits of the unused-bit area 28-4 is calculated. In step S18, variable m is incremented by 1.

In step S19, a check is made as to whether n-m is larger than 0. In the case of n-m being larger than 0, the procedure goes back to step S15 for repeating the execution of the subsequent steps. Namely, next $W_{n-m}$ is assigned to the area of unused bits in $W_n$. In the case of n-m being not larger than 0, the procedure proceeds to step S20.

In step S20, variable n is decreased by 1. In step S21, a check is made as to whether the following condition is satisfied: n is larger than 1 and $W_n$ is not present in the list. In the case of the above-noted condition being satisfied, the procedure returns to step S20 in which variable n is further decreased by 1, followed by checking whether next $W_n$ is present.

In the case of the condition of step S21 being not satisfied, a check is made in step S22 as to whether n is larger than 1. In the case of n being larger than 1, the procedure goes back to step S14 for repeating the execution of the subsequent steps. Namely, allocation to new $W_n$ is performed. In the case of n being not larger than 1, the procedure of FIG. 7 comes to an end.

Figure 10:
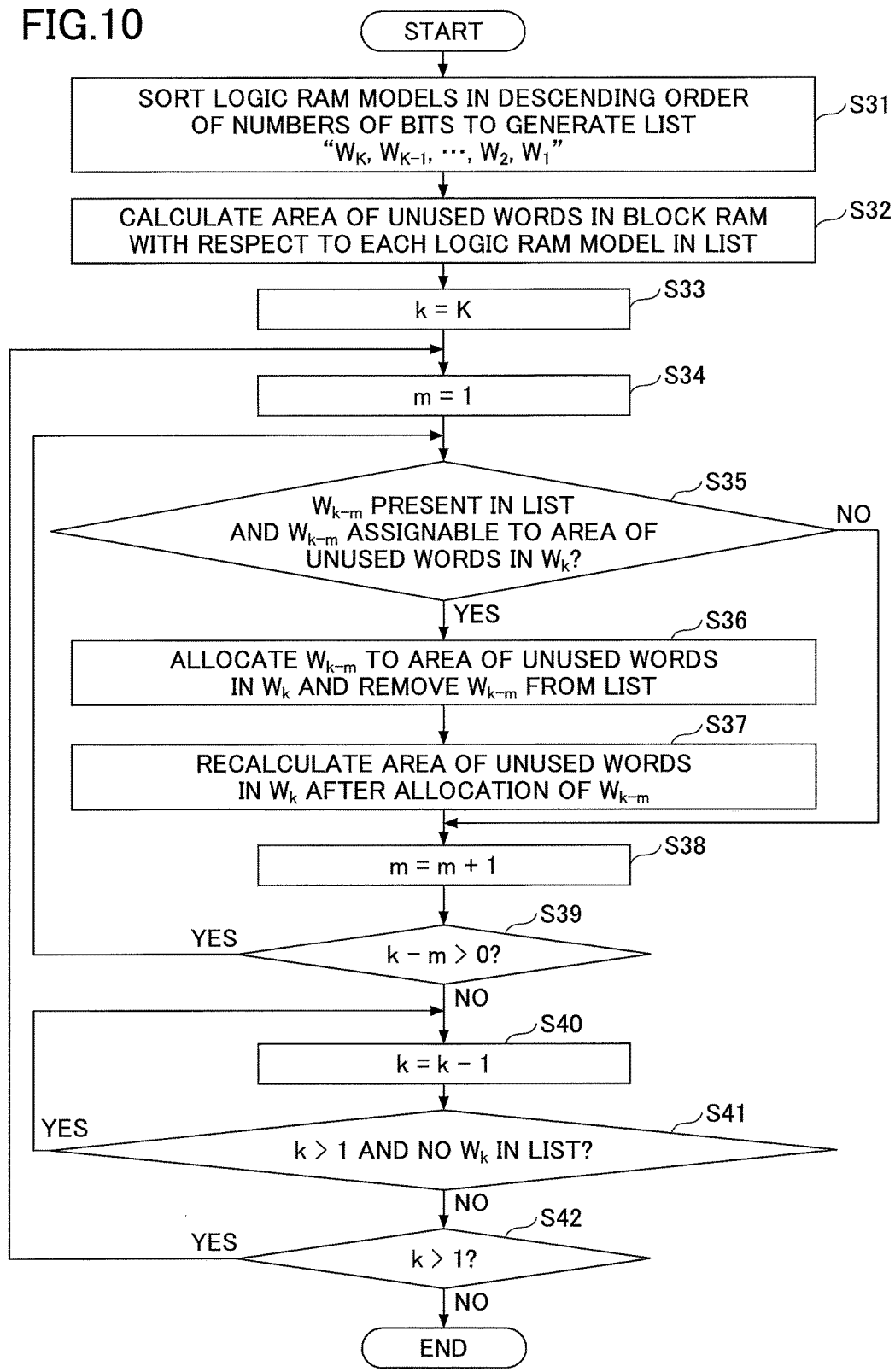
FIG. 10 is a flowchart illustrating an example of the procedure for allocating RAMs.

FIG. 10 is a flowchart illustrating an example of the procedure for allocating RAMs. The procedure illustrated in FIG. 10 is performed after the procedure of FIG. 7 in step S5 of FIG. 1. Each step illustrated in FIG. 10 may be automatically performed by the design apparatus.

In step S31, the logic RAM models in the list existing at the end of the procedure of FIG. 7 are sorted in the descending order of the number of bits, thereby producing a list in which the logic RAM models are arranged in the descending order of the number of bits. This list is denoted as "$W_K$, $W_{K-1}$, ..., $W_2$, $W_1$". With respect to a logic RAM model having a plurality of RAMs allocated thereto in the procedure of FIG. 7, the number of bits compared in this sorting process is equal to the total number of bits in RAMs. In step S32, the size of the area of unused words in a block RAM is calculated with respect to each logic RAM model in the list.

Figure 11:
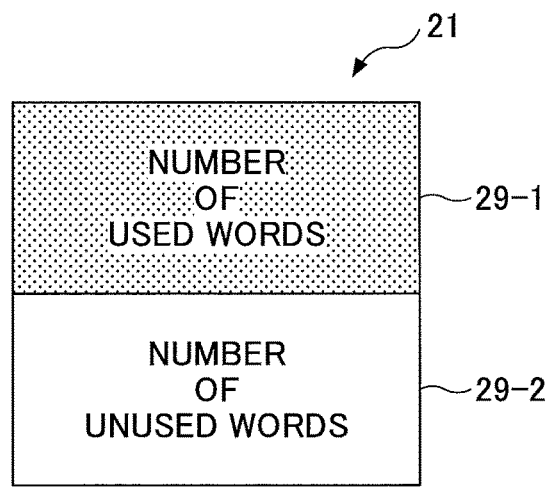
FIG. 11 is a drawing illustrating the area of unused words in a block RAM.

FIG. 11 is a drawing illustrating the area of unused words in a block RAM. The single block RAM 21 has a single RAM 29-1 allocated thereto. The number of words in a remaining area 29-2 is referred to as the number of words of the area of unused words.

By referring to FIG. 10 again, in step S33, the total number K of logical RAM models in the list is assigned to variable k. In step S34, variable m is set to 1. In step S35, a check is made as to whether the following condition is satisfied: $W_{k-m}$ is present in the list and $W_{k-m}$ is assignable to the area of unused bits in $W_k$. In the case of the above-noted condition being satisfied, the procedure proceeds to step S36. In the case of the above-noted condition being not satisfied, the procedure proceeds to step S38. In step S36, $W_{k-m}$ is assigned to the area of unused bits in $W_k$, followed by removing $W_{k-m}$ from the list.

Figure 12:
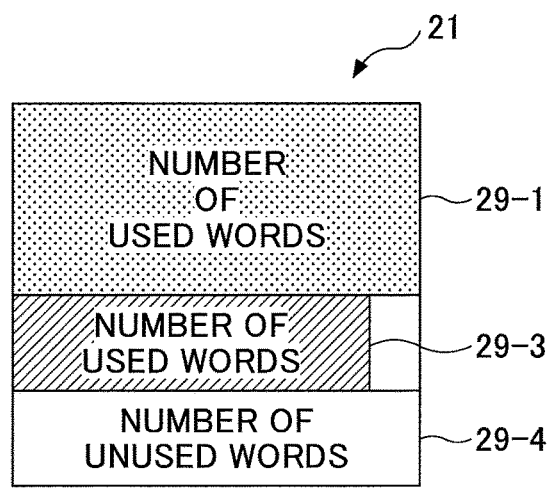
FIG. 12 is a drawing illustrating the allocation of a RAM to the area of unused words in a block RAM.

FIG. 12 is a drawing illustrating the allocation of a RAM to the area of unused words in a block RAM. The single block RAM 21 has two RAMs 29-1 and 29-3 allocated thereto. The number of words in a remaining area 29-4 is referred to as the number of words of the area of unused words. The RAM 29-1 is the RAM ($W_k$) that has been in existence from the initial state, and the RAM 29-3 is the RAM ($W_{k-m}$) that has been subsequently added. As was previously noted, the items in the list "$W_K$, $W_{K-1}$, ..., $W_2$, $W_1$" are arranged in the descending order of the number of bits. Accordingly, the number of bits in $W_{k-m}$ is smaller than the number of words in $W_k$, and the RAM 29-3 has a shorter width in the horizontal direction than the RAM 29-1 in FIG. 9.

By referring to FIG. 10 gain, in step S37, the size of the area of unused words in $W_k$ upon the allocation of $W_{k-m}$ is recalculated. In the example illustrated in FIG. 12, for example, the number of words of the unused-word area 29-4 is calculated. In step S38, variable m is incremented by 1.

In step S39, a check is made as to whether k-m is larger than 0. In the case of k-m being larger than 0, the procedure goes back to step S35 for repeating the execution of the subsequent steps. Namely, next $W_{k-m}$ is assigned to the area of unused words in $W_k$. In the case of k-m being not larger than 0, the procedure proceeds to step S40.

In step S40, variable k is decreased by 1. In step S41, a check is made as to whether the following condition is satisfied: k is larger than 1 and $W_k$ is not present in the list. In the case of the above-noted condition being satisfied, the procedure returns to step S40 in which variable k is further decreased by 1, followed by checking whether next $W_k$ is present.

In the case of the condition of step S41 being not satisfied, a check is made in step S42 as to whether k is larger than 1. In the case of k being larger than 1, the procedure goes back to step S34 for repeating the execution of the subsequent steps. Namely, allocation to new $W_k$ is performed. In the case of k being not larger than 1, the procedure of FIG. 10 comes to an end.

Figure 13:
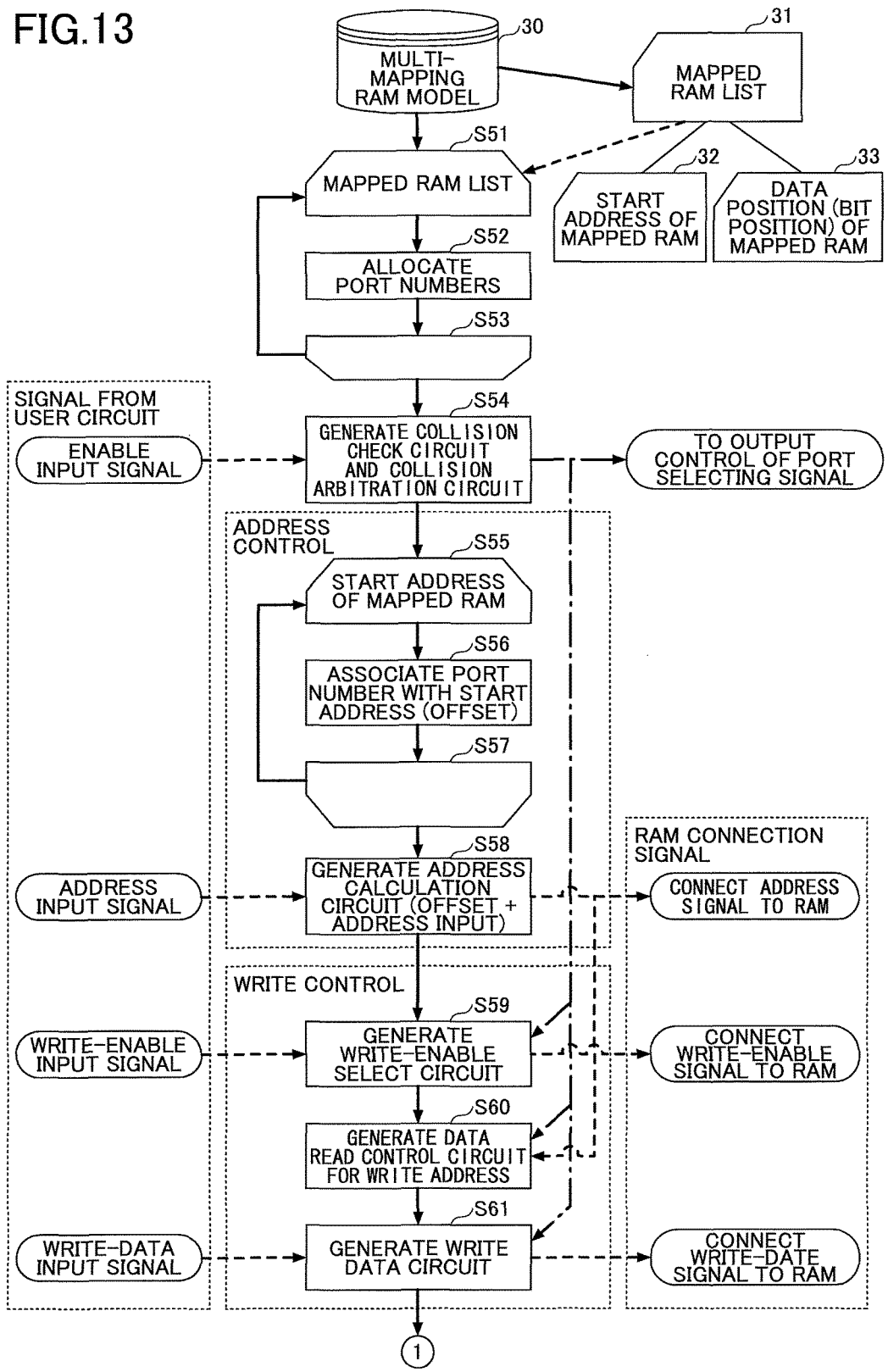
FIG. 13 is a flowchart illustrating an example of the procedure for generating a control circuit for a RAM for which multiple mapping has been performed.

FIG. 13 is a flowchart illustrating an example of the procedure for generating a control circuit for a RAM for which multiple mapping has been performed. The procedure illustrated in FIG. 13 is performed in step S5 of FIG. 1. Each step illustrated in FIG. 13 may be automatically performed by the design apparatus. The procedure illustrated in FIG. 13 generates a control circuit as a description in the hardware description language for controlling the input and output signals of the plurality of RAMs allocated to a single FPGA block RAM in order to allow each of the plurality of RAMs to be accessed as a single RAM.

The procedure illustrated in FIG. 13 is performed with respect to each RAM model for which multiple mapping has been performed. Namely, a single logic RAM model of interest is selected, and, then, the procedure illustrated in FIG. 13 is performed with respect to the single FPGA block RAM to which a plurality of RAMs are allocated. With respect to the logic RAM model 30 (i.e., one logic RAM model) for which multiple mapping has been performed, a list 31 of RAMs mapped to this RAM model is used in step S31.

In the loop constituted by steps S51 through S53, a port number assigning process of step 52 is performed with respect to each of the RAMs included in the list 31 of RAMs. Specifically, the input and output ports are allocated to each RAM, and, also, port numbers are assigned to the input and output ports. Port numbers may be consecutive numbers ranging from 1 and onwards (e.g., in the ascending order) that are successively assigned to the RAMs in the list.

In step S54, the design apparatus generates a collision check circuit and a collision arbitration circuit. Namely, the design apparatus generates the descriptions of the collision check circuit and the collision arbitration circuit in the hardware description language. In so doing, an access request from an external source to a port to be accessed is assumed to be given as an assertion of an ENABLE signal supplied from the external source. The collision check circuit is designed to detect the occurrence of collision in the case that ENABLE signals are asserted for a plurality of ports in the same cycle. Further, the collision arbitration circuit is designed to allow a plurality of RAMs to be successively accessed in the case of access collision being present with respect to these RAMs. More specifically, the collision arbitration circuit is designed to confer, upon the occurrence of collision, the right to access a port in the ascending order of port numbers with respect to the ports for which collision is detected. Namely, the collision arbitration circuit confers the right to access a port in a round-robin. As an example of a specific circuit configuration, a port selector circuit may produce, based on signals from the collision arbitration circuit, a port selecting signal to select a port for which the access right is conferred. In the case of no access collision, the port selector circuit may produce a port selecting signal to select a port corresponding to an asserted ENABLE signal in response to the assertion of the ENABLE signal from an external source. Automatic generation of the collision check circuit and the collision arbitration circuit ensures that the minimum amount of labor be spent on the additional designing process that has become necessary for mapping a plurality of RAMs to a single FPGA block RAM. This enables the development of an FPGA circuit capable of proper operations without incurring a cost increase.

In the loop constituted by steps S55 through S57, the start address of each of the mapped RAMs is assigned to a respective one of the port numbers. It may be noted that information about the start address of each of the mapped RAMs is provided as start address information 32, which is included in the logic RAM model 30 for which multiple mapping has been performed. The design apparatus may generate a table in which the port numbers are associated with the respective start addresses.

In step S58, the design apparatus generates an address calculation circuit. Namely, the design apparatus may generate the descriptions of the address calculation circuit in the hardware description language. Specifically, an address selecting and offset adjusting circuit is generated that selects one of the ports in response to the port selecting signal, and that adds an offset to address data supplied to the selected port from an external source. The address selecting and offset adjusting circuit adds the offset to convert the address supplied from the external source into an address used for accessing a given one of the RAMs. Automatic generation of the address selecting and offset adjusting circuit ensures that the minimum amount of labor be spent on the additional designing process that has become necessary for mapping a plurality of RAMs to a single FPGA block RAM. This enables the development of an FPGA circuit capable of proper operations without incurring a cost increase.

In step S59, the design apparatus generates a write-enable select circuit. Namely, the design apparatus generates the descriptions of the write-enable select circuit in the hardware description language. The write-enable select circuit selects one of the ports in response to the port selecting signal, and applies to the RAM the write-enable signal supplied from the external source to the selected port.

In step S60, the design apparatus generates a read control circuit for reading data from a write address. Namely, the design apparatus generates the descriptions of the read control circuit in the hardware description language. In the case of a plurality of RAMs being allocated in the bit direction, a write operation performed with respect to a given word address in one of the RAMs in a straightforward manner causes the data stored at this word address in the remaining RAMs to be destroyed. This is because a plurality of RAMs are seemingly allocated to a single physical block RAM. In the case of a plurality of RAMs being allocated in the bit direction, thus, the data at the write word address are read, and the portion of the data at the bit positions corresponding to the RAM subjected to the write operation are replaced with the write data, followed by writing the data with the replaced portion into the RAM. Namely, data are read from the RAMs allocated in the bit direction, and part of the read data is replaced with the write data supplied from the external source, followed by writing the data with the replaced part into the RAMs. This write operation is performed by a write data generating circuit, which will be described in the following.

In step S61, the design apparatus generates a write data generating circuit. Namely, the design apparatus may generate the descriptions of the write data generating circuit in the hardware description language. In the case of a plurality of RAMs being not allocated in the bit direction, the write data generating circuit selects one of the ports in response to the port selecting signal, and inputs into the RAM the write data that is supplied from the external source to the selected port. In the case of a plurality of RAMs being allocated in the bit direction, the write data generating circuit reads data from the write word address, and replaces with the write data the portion of the data situated at the bit positions corresponding to the RAM subjected to the write operation, followed by supplying the data with the replaced portion into the RAM. Automatic generation of the write data generating circuit ensures that the minimum amount of labor be spent on the additional designing process that has become necessary for mapping a plurality of RAMs to a single FPGA block RAM. This enables the development of an FPGA circuit capable of proper operations without incurring a cost increase.

Figure 15:
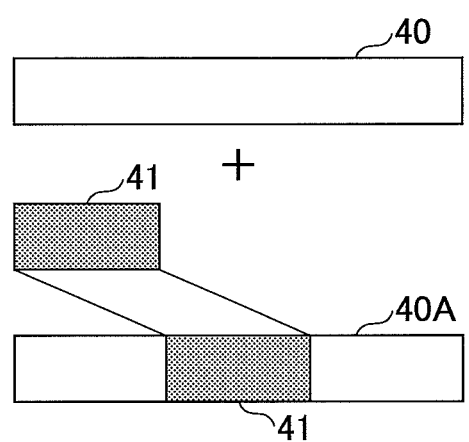
FIG. 15 is a drawing illustrating an operation performed at the time of data writing.

FIG. 15 is a drawing illustrating an operation performed at the time of data writing. Write data 41 is inserted into read data 40 at proper bit positions, thereby producing read data 40A, part of which is replaced with the write data 41. This read data 40A is written into the RAMs (i.e., a single block RAM) as write data.

Figure 14:
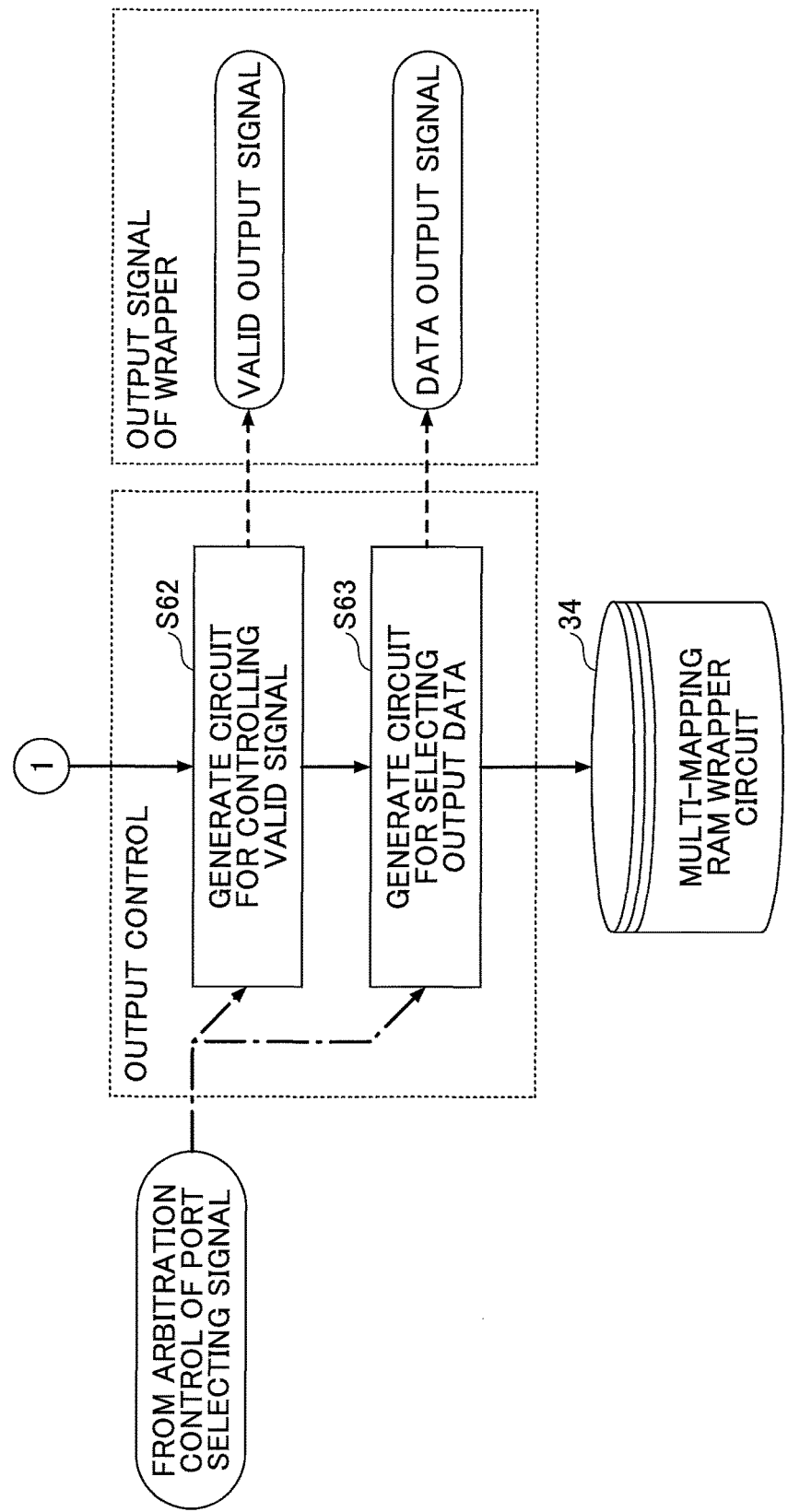
FIG. 14 is a flowchart illustrating a procedure subsequent to the procedure illustrated in FIG. 13.

FIG. 14 is a flowchart illustrating a procedure subsequent to the procedure illustrated in FIG. 13. In step S62, the design apparatus generates a VALID signal control circuit for generating a VALID signal. Namely, the design apparatus may generate the descriptions of the VALID signal control circuit in the hardware description language. Specifically, the VALID signal control circuit asserts the VALID signal output from the output port indicated by the port selecting signal upon the completion of a RAM operation of this port. The VALID signal control circuit may also assert VALID signals with respect to the ports for which no access request is being made. The VALID signal control circuit serves as a circuit for outputting signals indicative of accessible RAMs among the plurality of RAMs. Automatic generation of the VALID signal control circuit ensures that the minimum amount of labor be spent on the additional designing process that has become necessary for mapping a plurality of RAMs to a single FPGA block RAM. This enables the development of an FPGA circuit capable of proper operations without incurring a cost increase.

In step S63, the design apparatus generates an output data select circuit. Namely, the design apparatus may generate the descriptions of the output data select circuit in the hardware description language. Specifically, the output data select circuit outputs, from the output port indicated by the port selecting signal, a RAM read signal in conformity with the latency required for a RAM access operation. In the case of a write operation, the output data is "don't care".

The processes described above generate a multi-mapping RAM wrapper circuit 34. The multi-mapping RAM wrapper circuit 34 includes an FPGA block RAM having a plurality of RAMs allocated thereto and various control circuits generated by the processes of FIG. 13 and FIG. 14.

Figure 16:
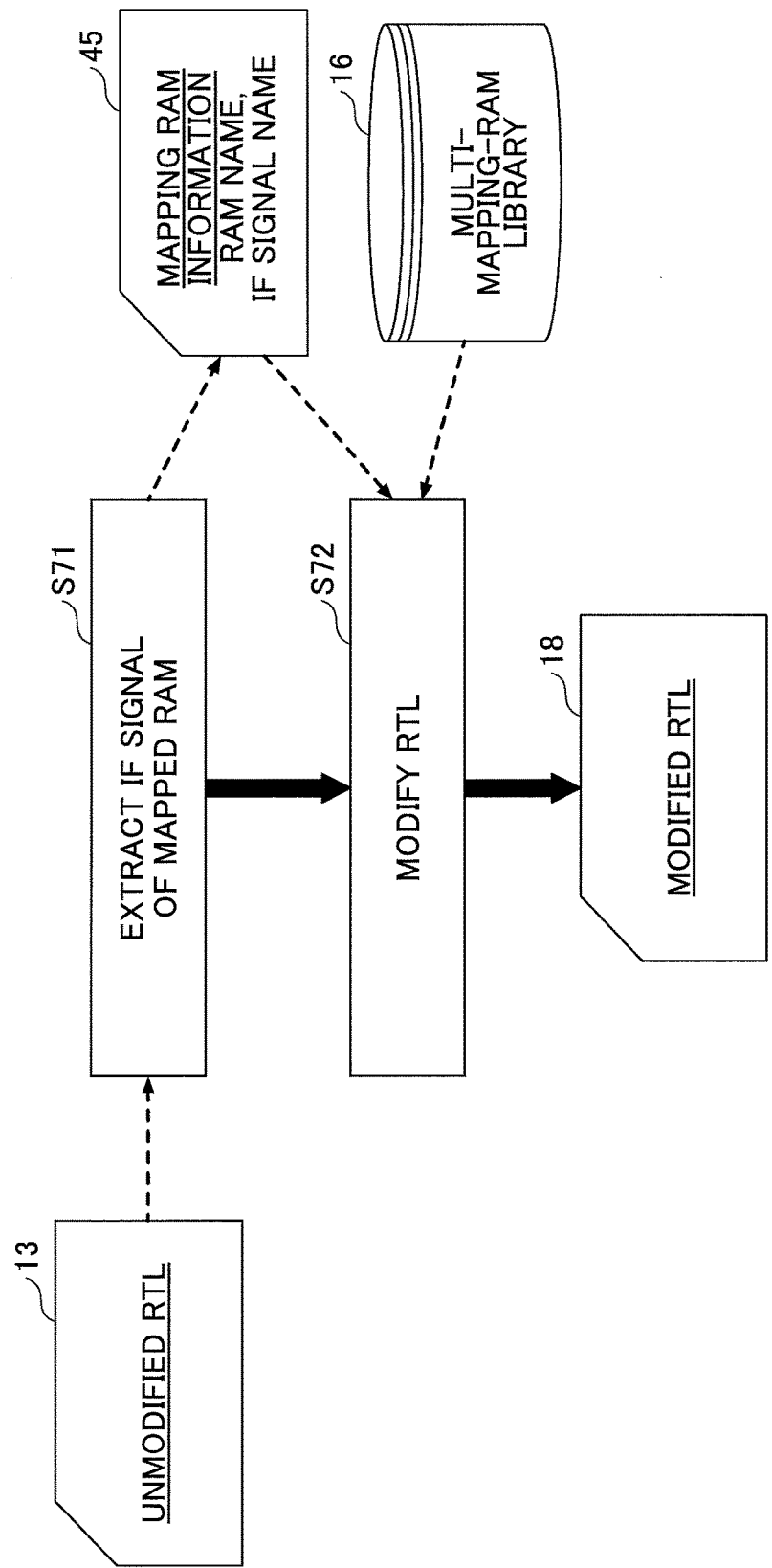
FIG. 16 is a drawing illustrating an example of a schematic procedure of a pull-put process for a RAM for which multiple-mapping has been performed.

FIG. 16 is a drawing illustrating an example of a schematic procedure of a pull-put process for a RAM for which multiple-mapping has been performed. The processes illustrated in FIG. 16 are performed in step S6 of FIG. 1. The design apparatus may automatically perform the processes illustrated in FIG. 16.

In step S71, the design apparatus extracts (i.e., identifies) the input and output signals of each RAM that is allocated together with one or more other RAMs to any FPGA block RAM among RAMs existing in the circuit under design. This extraction process produces mapping RAM information 45 that includes RAM identification information of each RAM and identification information indicative of the input and output signals.

In step S72, the design apparatus modifies the RTL description. Specifically, the design apparatus reconnects the input and output signals identified by the mapping RAM information 45 to the control circuits of the logic RAM models included in the logic-RAM library 16. This generates a modified RTL description 18 including RAMs for which multiple mapping has been performed.

Such modification of the RTL description relates only to the reconnection of input and output signals, and does not involve modifications to the substance of the RTL description. Further, the input and output signals of RAMs can be reconnected automatically. Accordingly, only a minimum amount of labor is spent on the additional designing process that has become necessary for mapping a plurality of RAMs to a single FPGA block RAM. This enables the development of an FPGA circuit capable of proper operations without incurring a cost increase.

Figure 17:
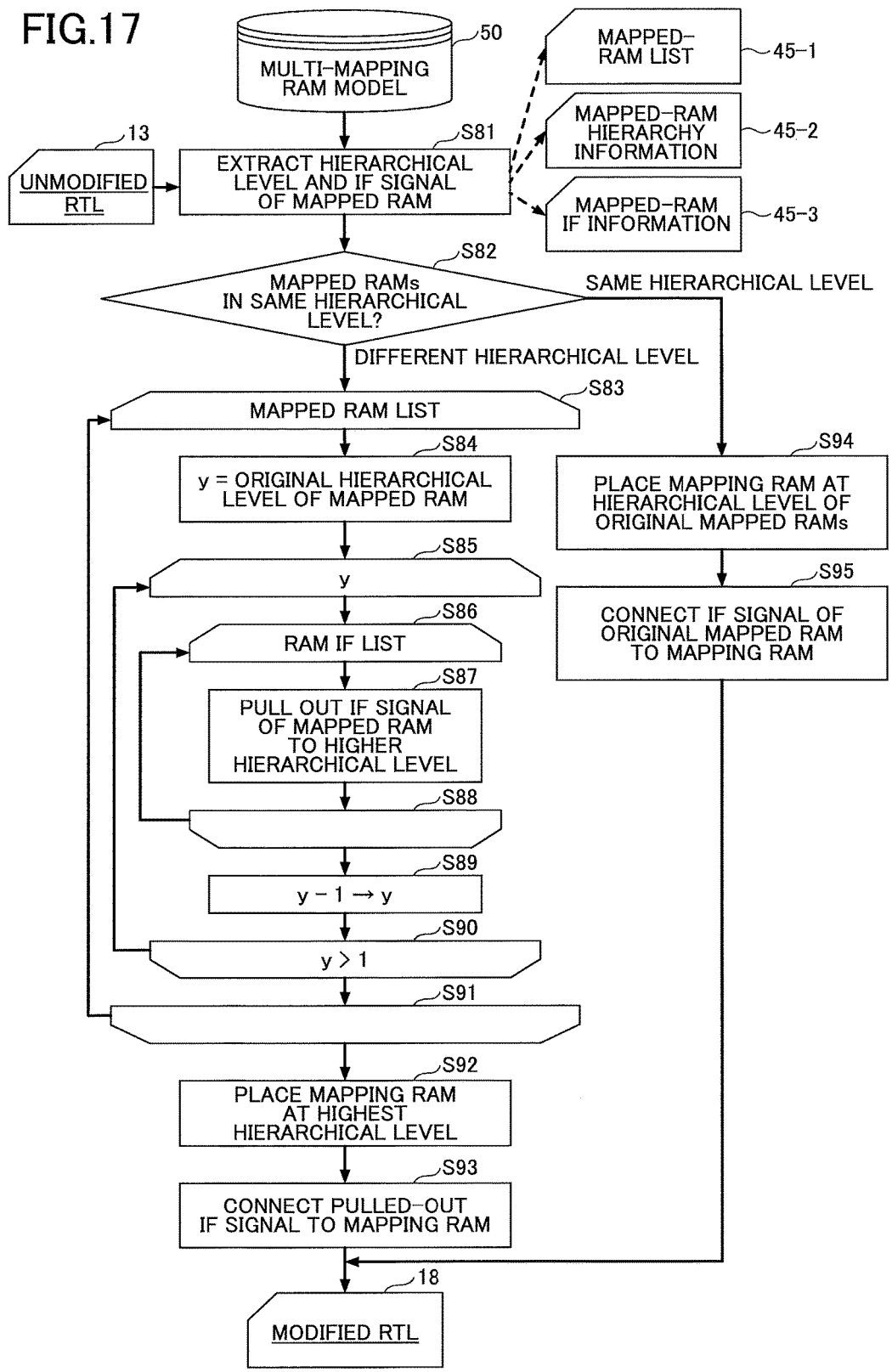
FIG. 17 is a drawing illustrating an example of a detailed procedure of a pull-put process for a RAM for which multiple-mapping has been performed.

FIG. 17 is a drawing illustrating an example of a detailed procedure of a pull-put process for a RAM for which multiple-mapping has been performed. The processes illustrated in FIG. 17 are performed in step S6 of FIG. 1. The design apparatus may automatically perform the processes illustrated in FIG. 17.

The procedure illustrated in FIG. 17 is performed with respect to each RAM model for which multiple mapping has been performed. Namely, a single logic RAM model of interest is selected, and, then, the procedure illustrated in FIG. 17 is performed with respect to the single logic RAM model including control circuits and a single FPGA block RAM to which a plurality of RAMs are allocated.

In step S81, the design apparatus performs, with respect to each of the plurality of RAMs allocated to a single logic RAM model (multi-mapping RAM model) 50, a process of extracting from the RTL description 13 the input and output signals of the RAM and the layer in which the RAM is disposed. This extraction process produces a mapped-RAM list 45-1, a mapped-RAM layer information 45-2, and a mapped-RAM IF information (i.e., input-and-output-signal information) 45-3.

In step S82, a check is made as to whether all the RAMs identified in the mapped-RAM list 45-1 are disposed in the same layer in the RTL description 13. In the case of all the RAMs being disposed in the same layer, a multiple-mapping logic RAM model 50 is placed in this layer in step S94. In step S95, the input and output signals identified by the mapped-RAM IF information 45-3 are connected to the multiple-mapping logic RAM model 50 placed in the above-noted layer.

In the case of the RAMs being not disposed in the same layer, the loop constituted by steps S83 and S91 performs the processes of steps S84 through S90 successively for each of the RAMs listed in the mapped-RAM list 45-1. In step S84, the hierarchical level, in the RTL description 13, of the RAM of interest in the mapped-RAM list 45-1 is assigned to y. Here, hierarchical level "1" is the highest (i.e., uppermost) hierarchical level.

The loop constituted by the steps S85 and S90 performs the processes of steps S86 through S88 while decreasing y by one in each loop cycle. Steps S86 through S88 successively perform, with respect to each of the input and output signals identified by the mapped-RAM IF information 45-3, a process of modifying the RTL description to pull out the signal to the layer immediately above the layer identified by y.

Through the processes of steps S83 through S91 described above, all the input and output signals identified by the mapped-RAM IF information 45-3 are pulled out to the highest hierarchical level. In step S92, the multiple-mapping logic RAM model 50 is placed in the highest hierarchical level. In step S93, the input and output signals pulled out to the highest hierarchical level are connected to the multiple-mapping logic RAM model 50 placed in the highest hierarchical level. The processes described above generate the modified RTL description 18.

Figure 18:
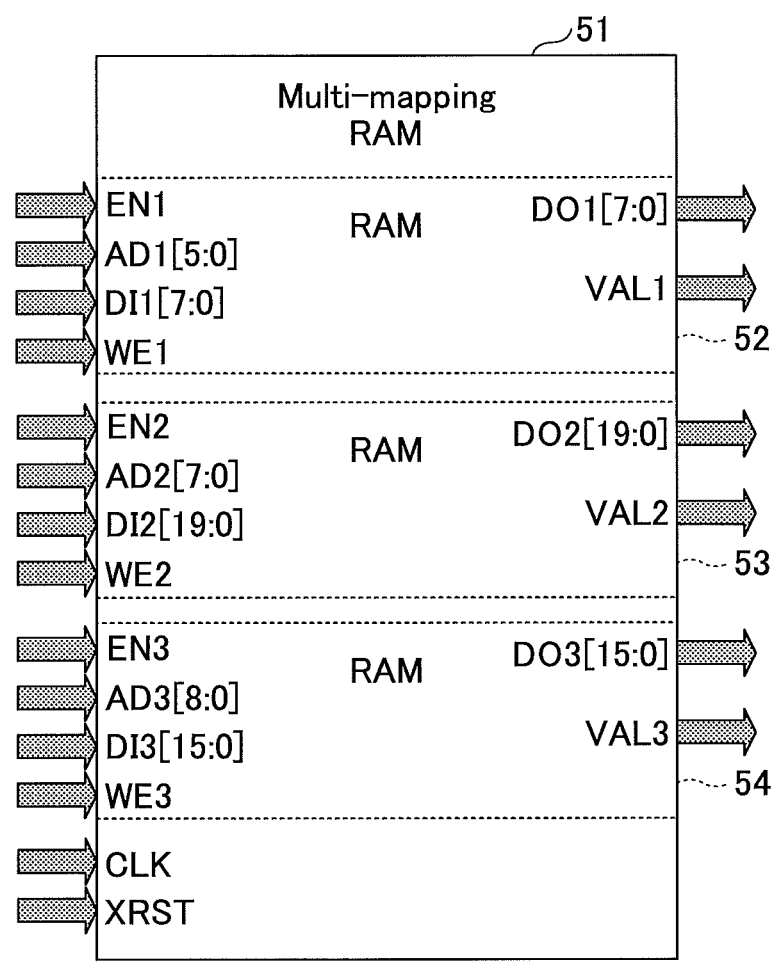
FIG. 18 is a drawing illustrating an example of the input and output signals of a multiple-mapping logic RAM model.

FIG. 18 is a drawing illustrating an example of the input and output signals of the multiple-mapping logic RAM model. A multi-mapping RAM 51 illustrated in FIG. 18 includes a RAM 52, a RAM 53, and a RAM 54. The RAM 52 receives input signals that are an enable signal EN1, a six-bit address signal AD1[5:0], an eight-bit data signal DI1[7:0], and a write-enable signal WE1. The RAM 52 outputs output signals that are an eight-bit data signal DO1[7:0] and a VALID signal VAL1. The RAM 53 receives input signals that are an enable signal EN2, an eight-bit address signal AD2[7:0], a twenty-bit data signal DI2[19:0], and a write-enable signal WE2. The RAM 53 outputs output signals that are a twenty-bit data signal DO2[19:0] and a VALID signal VAL2. The RAM 54 receives input signals that are an enable signal EN3, a nine-bit address signal AD3[8:0], a sixteen-bit data signal DI3[15:0], and a write-enable signal WE3. The RAM 54 outputs output signals that are a sixteen-bit data signal DO3[15:0] and a VALID signal VAL3. The multi-mapping RAM 51 further receives a clock signal CLK and a system reset signal XRST as input signals.

FIG. 19 is a table illustrating the input and output signals of the logic RAM model illustrated in FIG. 8. The column identified as "I/O" indicates a distinction between the input "I" and the output "0". "P/N" indicates the polarity of the signal. RAM1 through RAM3 in the table refer to the RAMs 52 through 54, respectively, illustrated in FIG. 18. A signal having "–" in the "bit" column has a bit width of 1 bit.

Figure 20:
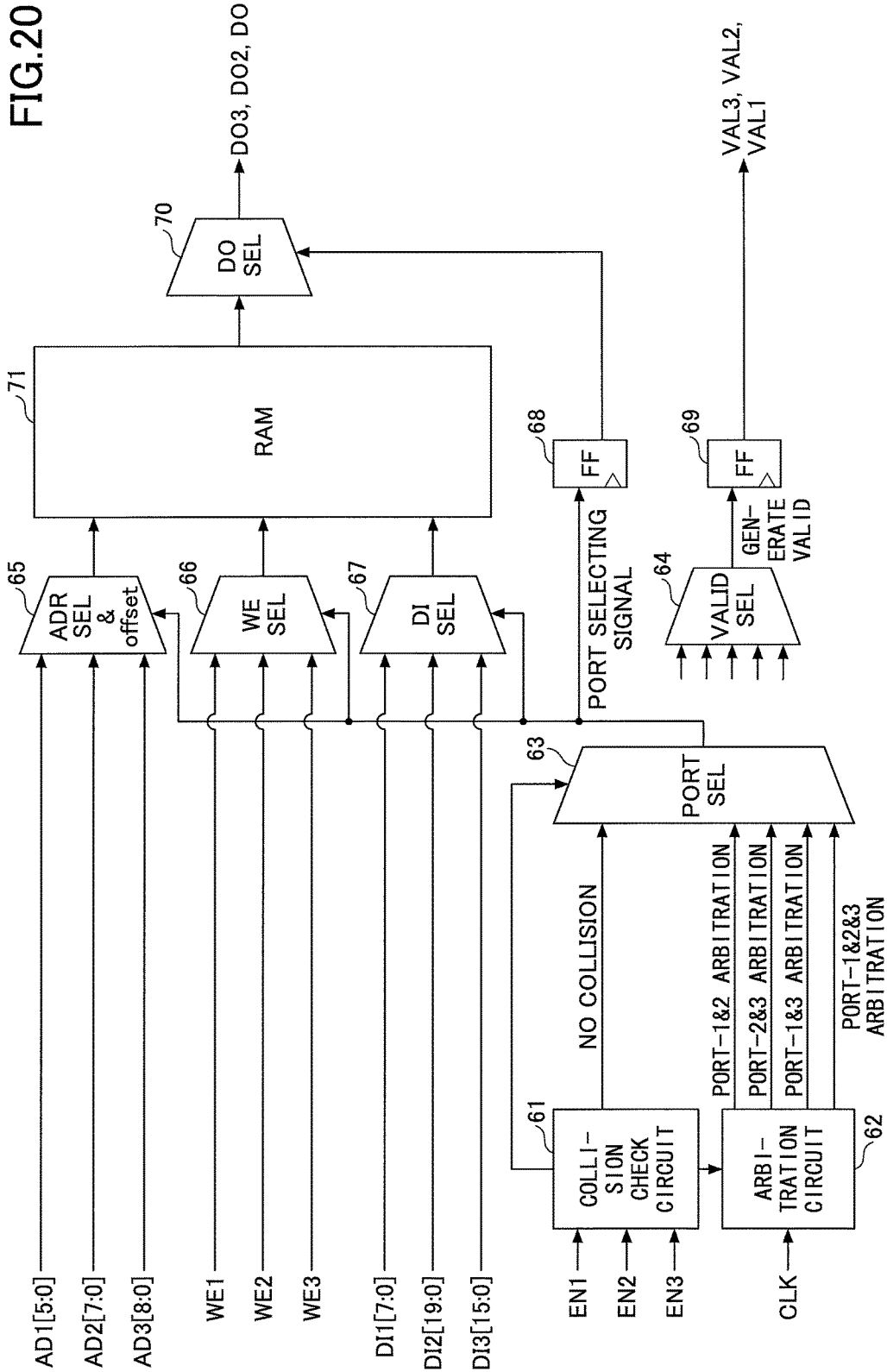
FIG. 20 is a drawing illustrating an example of the circuit configuration of the multi-mapping RAM illustrated in FIG. 18.

FIG. 20 is a drawing illustrating an example of the circuit configuration of the multi-mapping RAM illustrated in FIG. 18. The multi-mapping RAM illustrated in FIG. 20 includes a collision check circuit 61, an arbitration circuit 62, a port selector 63, a VALID selector 64, an address-select-&-offset-adjustment circuit 65, a write-enable selector 66, and an input data selector 67. The multi-mapping RAM further includes a flip-flop 68, a flip-flop 69, an output data selector 70, and an FPGA block RAM 71.

The collision check circuit 61 asserts a signal regarding a collision state when any two or more signals of the enable signals EN1 through EN3 are simultaneously placed in the asserted state. Based on the signal regarding a collision state from the collision check circuit 61, the arbitration circuit 62 outputs signals for arbitrating between the ports that are in the collision state. The signal for arbitration includes a signal for arbitrating between port-1 and port-2, a signal for arbitrating between port-2 and port-3, a signal for arbitrating between port-1 and port-3, and a signal for arbitrating between port-1 through port-3.

Based on the signal regarding a collision state from the collision check circuit 61, the port selector 63 selects and outputs either the enable signals EN1 through EN3 supplied from an external source or one of the signals for arbitrating between ports supplied from the arbitration circuit 62. The output signal of the port selector 63 is a port selecting signal indicative of the elected port, i.e., the port for which access is granted. Based on the signal regarding a collision state from the collision check circuit 61, the VALID selector 64 selects and outputs either a fixed value of "111" or one of the signals supplied from the arbitration circuit 62. The output signal of the VALID selector 64 is delayed by the flip-flop 69 by a delay length equal to the latency of a read operation of the FPGA block RAM 71, and is output as the valid signals VAL1 through VAL3, which indicate accessible ports.

The address-select-&-offset-adjustment circuit 65 selects an input address (i.e., one of AD1 through AD3) of the port indicated by the port selecting signal, and adds to the selected address an offset value corresponding to the port indicated by the port selecting signal, thereby generating a converted address. The converted address is applied to the FPGA block RAM 71. The write-enable selector 66 selects a write-enable signal (i.e., one of WE1 through WE3) of the port indicated by the port selecting signal, and supplies the selected write-enable signal to the FPGA block RAM 71. The input data selector 67 selects an input data signal (i.e., one of DI1 through DI3) of the port indicated by the port selecting signal, and supplies the selected input data signal to the FPGA block RAM 71.

The flip-flop 68 delays the port selecting signal by a delay length equal to the latency of the read operation of the FPGA block RAM 71, and supplies the delayed port selecting signal to the output data selector 70. The output data selector 70 outputs the read data output from the FPGA block RAM 71 as the output signal of the port indicated by the delayed port selecting signal. This output signal serves as the read data (i.e., one of DO1 through DO3) of the multi-mapping RAM 51.

Figure 21:
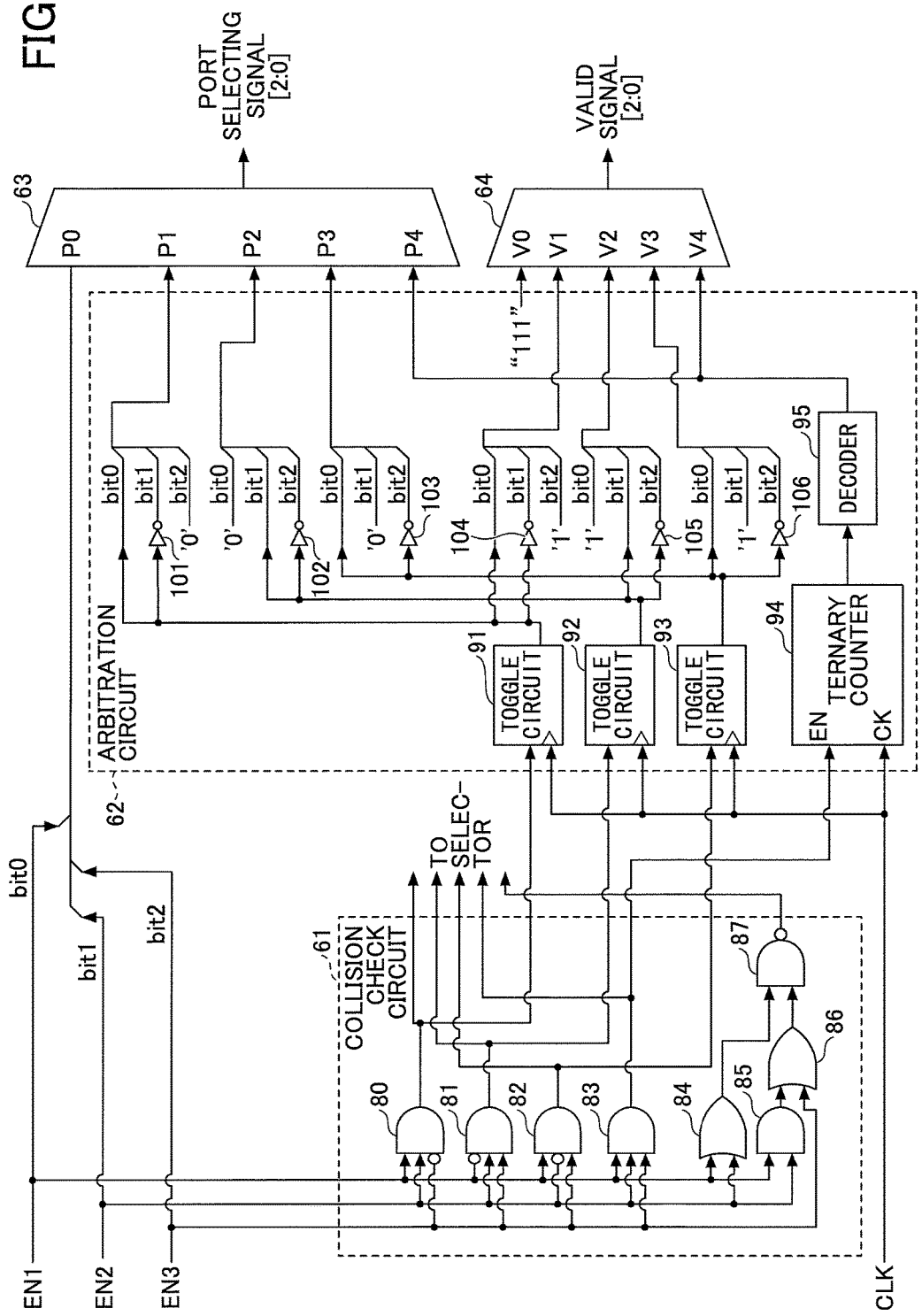
FIG. 21 is a drawing illustrating an example of the configuration of a collision check circuit and an arbitration circuit.

FIG. 21 is a drawing illustrating an example of the configuration of the collision check circuit and the arbitration circuit. The collision check circuit 61 illustrated in FIG. 21 includes AND gates 80 through 83, an OR gate 84, an AND gate 85, an OR gate 86, and a NAND gate 87. The enable signals EN1 through EN3, with one of these being inverted and the remaining two being not inverted, are applied to the AND gates 80 through 82, and are also applied, with none of these being inverted, to the AND gate 83. With this arrangement, the outputs of the AND gates 80, 81, 82, and 83 are asserted to HIGH in the case of collision between port-1 and port-2, in the case of collision between port-2 and port-3, in the case of collision between port-1 and port-3, and in the case of collision between port-1, port-2 and port 3, respectively. The OR gate 84, the AND gate 85, the OR gate 86, and the NAND gate 87 generate a signal that is asserted to HIGH in the case of no collision between the ports based on the enable signals EN1 through EN3 serving as inputs. Namely, the output of the NAND gate 87 becomes HIGH when only one of the enable signals EN1 through EN3 is HIGH or when all of these are LOW.

The arbitration circuit 62 includes toggle circuits 91 through 93, a ternary counter 94, a decoder 95, and inverters 101 through 106. The toggle circuits 91 through 93 receive enable signals that are asserted in the case of collision between port-1 and port-2, in the case of collision between port-2 and port-3, and in the case of collision between port-1 and port-3, respectively, and toggle in synchronization with the clock signal CLK. The ternary counter 94 receives an enable signal that is asserted in the case of collision between port-1, port-2 and port-3, and counts up cyclically in the range of 0 to 2 in synchronization with the clock signal CLK. The decoder 95 decodes the count value output from the ternary counter 94, and successively asserts a different one of the three output bits thereof.

The port selector 63 selects a P0 input in the case of no collision, a P1 input in the case of collision between port-1 and port-2, a P2 input in the case of collision between port-2 and port-3, a P3 input in the case of collision between port-1 and port-3, and a P4 input in the case of collision between port-1, port-2 and port-3. Specifically, the enable signals EN1 through EN3 applied to the P0 input are output without any change as the first through third bits, respectively, of the port selecting signal in the case of no collision. In the case of collision between port-1 and port-2, the output signal of the toggle circuit 91 of the arbitration circuit 62, the inverted signal thereof, and a fixed value of "0", which are applied to the P1 input, are output as the first through third bits, respectively, of the port selecting signal. In the case of collision between port-2 and port-3, a fixed value of "0", the output signal of the toggle circuit 92 of the arbitration circuit 62, and the inverted signal thereof, which are applied to the P2 input, are output as the first through third bits, respectively, of the port selecting signal. In the case of collision between port-1 and port-3, the output toggle signal of the toggle circuit 93 of the arbitration circuit 62, a fixed value of "0", and the inverted signal of the toggle signal, which are applied to the P3 input, are output as the first through third bits, respectively, of the port selecting signal. In the case of collision between port-1, port-2 and port-3, the three-bit output signal of the decoder 95 of the arbitration circuit 62, which is applied to the P4 input, are output as the first through third bits, respectively, of the port selecting signal.

The VALID selector 64 selects a V0 input in the case of no collision, a V1 input in the case of collision between port-1 and port-2, a V2 input in the case of collision between port-2 and port-3, a V3 input in the case of collision between port-1 and port-3, and a V4 input in the case of collision between port-1, port-2 and port-3. Specifically, a fixed value of "111" applied to the V0 input is output as the first through third bits of the VALID signal in the case of no collision. In the case of collision between port-1 and port-2, the output signal of the toggle circuit 91 of the arbitration circuit 62, the inverted signal thereof, and a fixed value of "1", which are applied to the V1 input, are output as the first through third bits, respectively, of the VALID signal. In the case of collision between port-2 and port-3, a fixed value of "1", the output signal of the toggle circuit 92 of the arbitration circuit 62, and the inverted signal thereof, which are applied to the V2 input, are output as the first through third bits, respectively, of the VALID signal. In the case of collision between port-1 and port-3, the output toggle signal of the toggle circuit 93 of the arbitration circuit 62, a fixed value of "1", and the inverted signal of the toggle signal, which are applied to the V3 input, are output as the first through third bits, respectively, of the VALID signal. In the case of collision between port-1, port-2 and port-3, the three-bit output signal of the decoder 95 of the arbitration circuit 62, which is applied to the V4 input, is inverted in each bit position and output as the first through third bits of the VALID signal.

Figure 22:
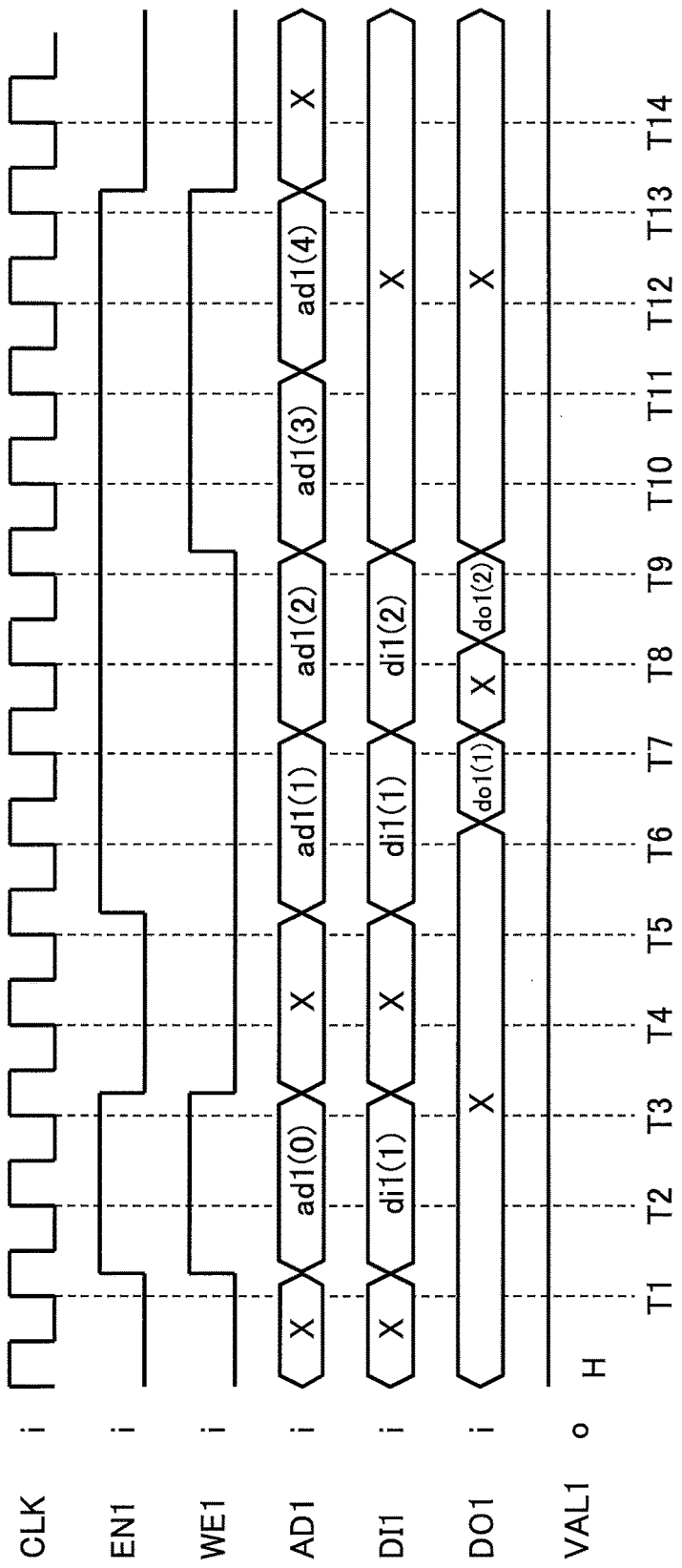
FIG. 22 is a timing chart illustrating an example of the operation of a multi-mapping RAM when one port thereof is accessed.

FIG. 22 is a timing chart illustrating an example of the operation of a multi-mapping RAM when one port thereof is accessed. In the cycle T1, the VALID signal VAL1 is asserted to HIGH, which indicates that port-1 is in the accessible state. In the cycle T2, the enable signal EN1 and the write-enable signal WE1 of port-1 are asserted, and address ad1(0) and data di1(1) are applied, thereby performing a write operation with respect to the RAM at port-1. In the cycle T6, further, the enable signal EN1 and the write-enable signal WE1 of port-1 are asserted and negated, respectively, and address ad1(1) is applied, thereby performing a read operation to read data do1(1) from the RAM at port-1. In the case of no collision between ports as illustrated in this example, an operation is completed in the cycle immediately following the cycle in which an access request is made, so that the VALID signal VAL1 stays at HIGH all the time.

Figure 23:
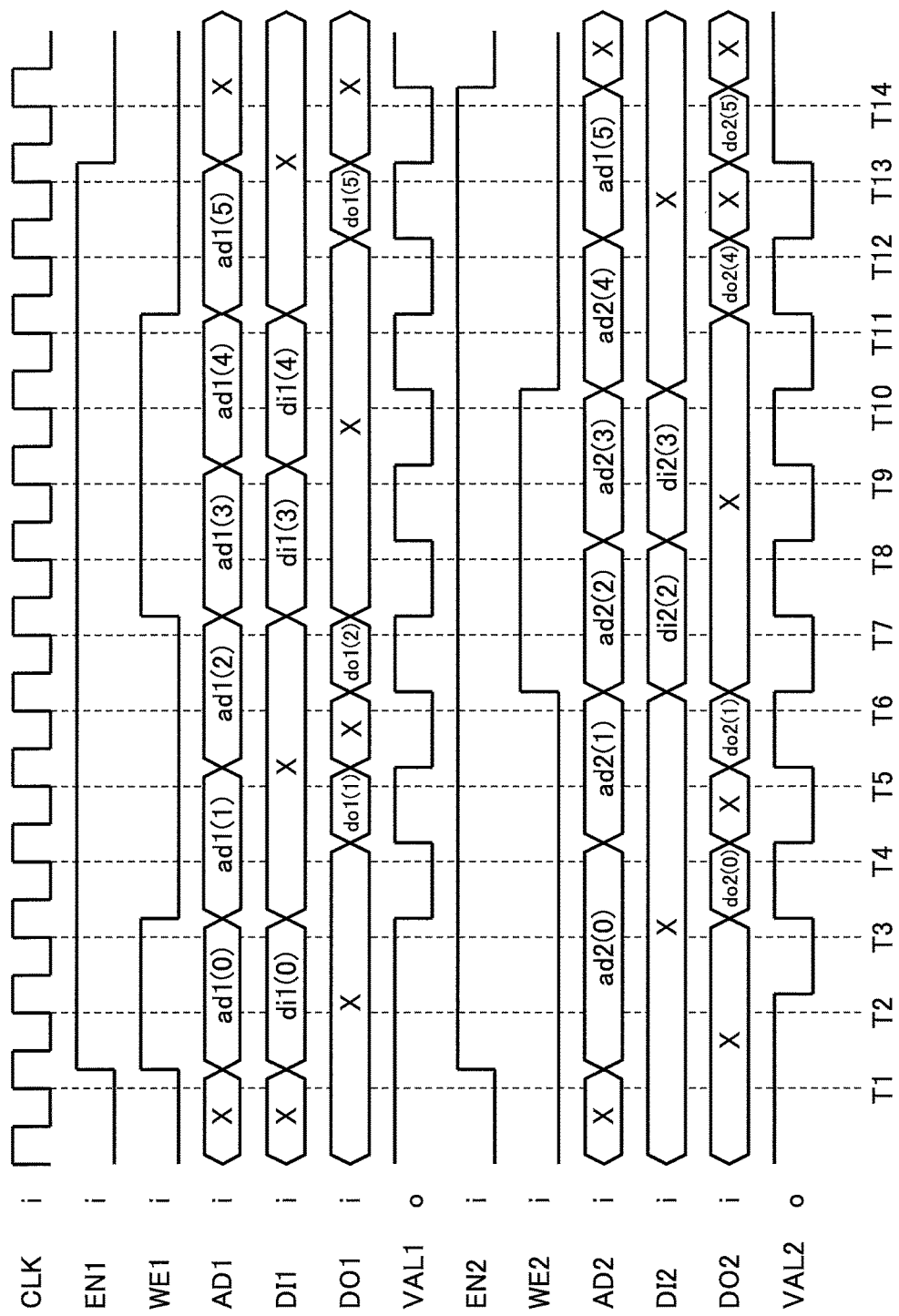
FIG. 23 is a timing chart illustrating an example of the operation of a multi-mapping RAM when two ports thereof are simultaneously accessed.

FIG. 23 is a timing chart illustrating an example of the operation of a multi-mapping RAM when two ports thereof are simultaneously accessed. In the cycle T1, the VALID signals VAL1 and VAL2 are asserted to HIGH, which indicates that port-1 and port-2 are in the accessible state. In the cycle T2, the enable signal EN1 and the write-enable signal WE1 of port-1 are asserted, and the enable signal EN2 of port-2 is asserted. Namely, access is simultaneously requested with respect to port-1 and port-2.

In the cycle T3, the VALID signal VAL1 of port-1 is placed in the asserted state, which indicates that the access request to port-1 has been completed. Accordingly, new address input ad1(1) is applied to port-1 in the next cycle T4. In the cycle T3 also, the VALID signal VAL2 of port-2 is placed in the negated state, which indicates that the access request to port-2 has not been completed. Accordingly, address input ad2(0) with respect to port-1 is maintained until the next cycle T4.

In the cycle T4, the VALID signal VAL1 of port-1 is placed in the negated state, which indicates that the access request to port-1 has not been completed. Accordingly, address input ad1(1) with respect to port-1 is maintained until the next cycle T5. In the cycle T4 also, the VALID signal VAL2 of port-2 is placed in the asserted state, which indicates that the access request to port-2 has been completed. Accordingly, new address input ad2(1) is applied to port-2 in the next cycle T5.

Thereafter, port-1 and port-2 are alternately granted access in a similar manner, so that the VALID signals VAL1 and VAL2 are alternately asserted.

Figure 24:
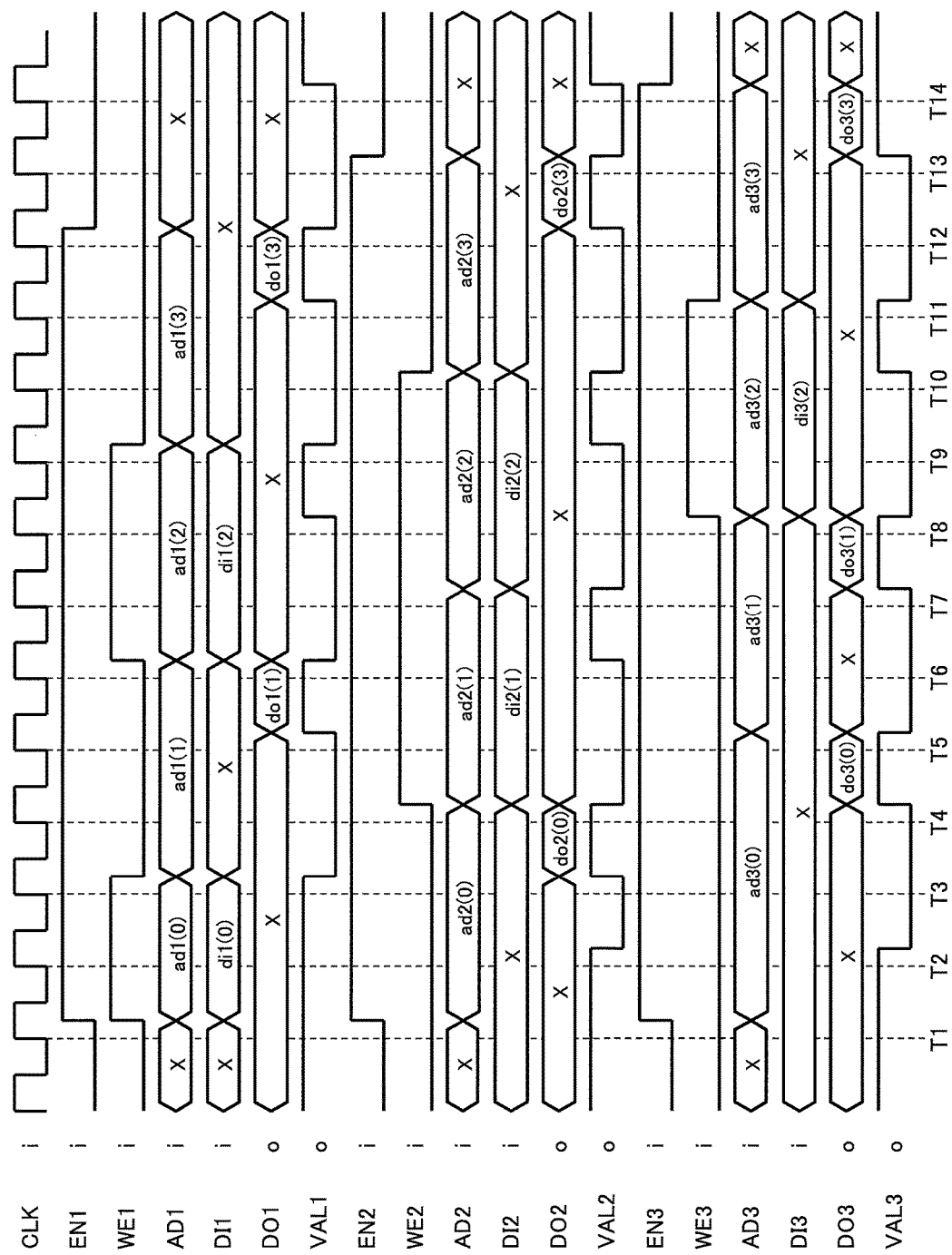
FIG. 24 is a timing chart illustrating an example of the operation of a multi-mapping RAM when the three ports thereof are simultaneously accessed.

FIG. 24 is a timing chart illustrating an example of the operation of a multi-mapping RAM when the three ports thereof are simultaneously accessed. In the cycle T1, the VALID signals VAL1 through VAL3 are asserted to HIGH, which indicates that port-1 through port-3 are in the accessible state. In the cycle T2, the enable signal EN1 through EN3 of port-through port-3 are asserted. Namely, access is simultaneously requested with respect to port-1 through port-3.

In the cycle T3, the VALID signal VAL1 of port-1 is placed in the asserted state, which indicates that the access request to port-1 has been completed. Accordingly, new address input ad1(1) is applied to port-1 in the next cycle T4. In the cycle T3 also, the VALID signal VAL2 of port-2 is placed in the negated state, which indicates that the access request to port-2 has not been completed. Accordingly, address input ad2(0) with respect to port-2 is maintained until the next cycle T4. In the cycle T3, further, the VALID signal VAL3 of port-3 is placed in the negated state, which indicates that the access request to port-3 has not been completed. Accordingly, address input ad3(0) with respect to port-3 is maintained until the next cycle T4.

In the cycle T4, the VALID signal VAL1 of port-1 is placed in the negated state, which indicates that the access request to port-1 has not been completed. Accordingly, address input ad1(1) with respect to port-1 is maintained until the next cycle T5. In the cycle T4 also, the VALID signal VAL2 of port-2 is placed in the asserted state, which indicates that the access request to port-2 has been completed. Accordingly, new address input ad2(1) is applied to port-2 in the next cycle T5. In the cycle T4, further, the VALID signal VAL3 of port-3 is placed in the negated state, which indicates that the access request to port-3 has not been completed. Accordingly, address input ad3(0) with respect to port-3 is maintained until the next cycle T5.

In the cycle T5, the VALID signal VAL1 of port-1 is placed in the negated state, which indicates that the access request to port-1 has not been completed. Accordingly, address input ad1(1) with respect to port-1 is maintained until the next cycle T6. In the cycle T5 also, the VALID signal VAL2 of port-2 is placed in the negated state, which indicates that the access request to port-2 has not been completed. Accordingly, address input ad2(1) with respect to port-2 is maintained until the next cycle T6. In the cycle T5, further, the VALID signal VAL3 of port-3 is placed in the asserted state, which indicates that the access request to port-3 has been completed. Accordingly, new address input ad3(1) is applied to port-3 in the next cycle T6.

Thereafter, port-1 through port-3 are sequentially granted access one by one, so that the VALID signals VAL1 through VAL3 are sequentially asserted one by one.

Figure 25:
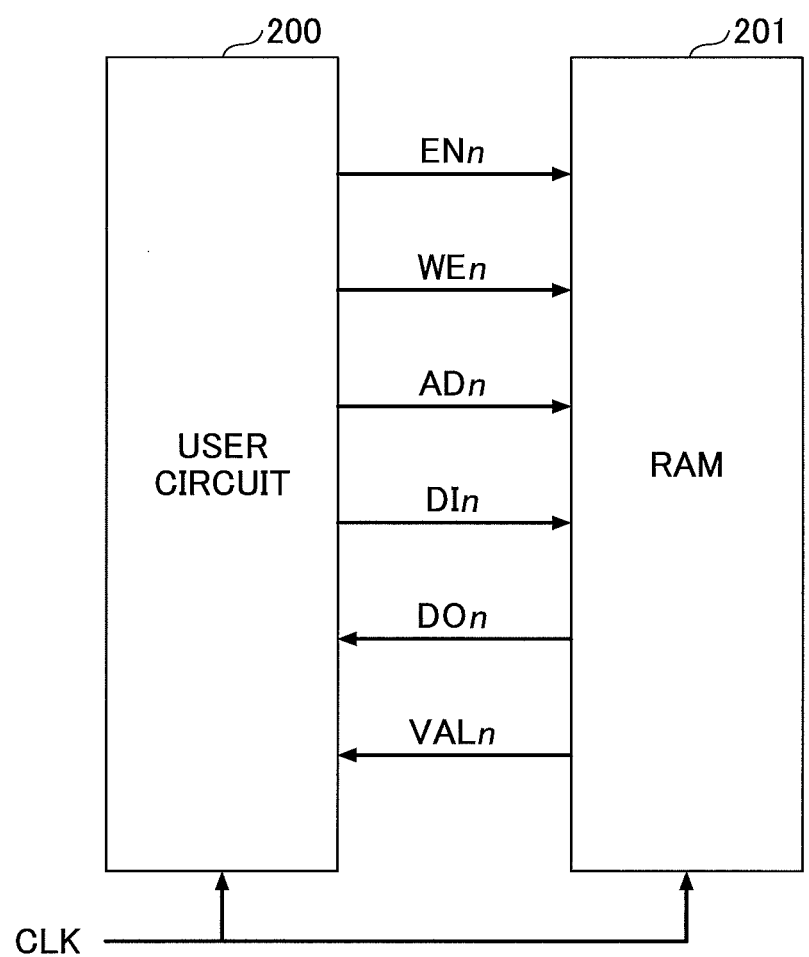
FIG. 25 is a drawing illustrating an example of connections between a user circuit and a multi-mapping RAM.

FIG. 25 is a drawing illustrating an example of connections between a user circuit and a multi-mapping RAM. A user circuit 200 accesses the n RAMs of a multi-mapping RAM 201 to perform access operations such as data writing and data reading. The user circuit 200 applies, to the multi-mapping RAM 201, n enable signals ENn, n write-enable signals WEn, n address signals ADn, and n write-data signals DIn corresponding to the n RAMs. The multi-mapping RAM 201 applies, to the user circuit 200, n read-data signals DOn and n VALID signals VALn corresponding to the n RAMs.

The user circuit 200 is designed to monitor the VALID signals and to perform an access operation only when a VALID signal is asserted. With the user circuit 200 being provided with such a function in advance, a proper access operation is enabled based on the VALID signals even when access collision occurs with respect to the logic RAM for which multiple mapping has been performed. Accordingly, the RTL description of the originally generated user circuit 200 does not have to be modified even in the case that a plurality of RAMs are allocated to a single block RAM upon knowing that there is a lack of RAM resources.

FIG. 26 is a timing chart illustrating an example of the operation of the user circuit accessing a multi-mapping RAM. In the cycle T2, the user circuit 200 detects that the VALID signal VALn is asserted to HIGH, which indicates that port-n is in the accessible state. In the cycle T3, the user circuit 200 performs a write operation with respect to the RAM at port-n by asserting the enable signal ENn and the write-enable signal WEn of port-n and applying an address signal and a data signal. In the cycle T8, the VALID signal VALn is asserted to HIGH, which indicates that port-n is in the accessible state. In the cycle T9, the user circuit 200 attempts to perform a read operation with respect to the RAM at port-n by asserting the enable signal ENn of port-n and applying address signal ad1(2). At this point in time, however, the user circuit 200 is performing an access operation with respect to another port, so that the access operation with respect to port-n is not completed until the cycle T12. Upon the VALID signal VALn being asserted to HIGH in the cycle T12, the user circuit 200 learns that the read operation with respect to port-n has been completed, thereby stopping the address signal input in the next cycle T13.

FIG. 27 is a drawing illustrating an example of the configuration of a design apparatus. As illustrated in FIG. 27, the apparatus for performing the design process disclosed herein is implemented as a computer such as a personal computer, an engineering workstation, or the like The apparatus of FIG. 27 includes a computer 510, a display apparatus 520 connected to the computer 510, a communication apparatus 523, and an input apparatus. The input apparatus includes a keyboard 521 and a mouse 522. The computer 510 includes a CPU (central processing unit) 511, a ROM 513, a secondary storage device 514 such as a hard disk, a removable-medium storage device 515, and an interface 516.

The keyboard 521 and mouse 522 provide user interface, and receive various commands for operating the computer 510 and user responses responding to data requests or the like. The display apparatus 520 displays the results of processing by the computer 510, and further displays various data that makes it possible for the user to communicate with the computer 510. The communication apparatus 523 provides for communication to be conduced with a remote site, and may include a modem, a network interface, or the like.

The design apparatus disclosed herein is provided as a computer program executable by the computer 510. This computer program is stored in a memory medium M that is mountable to the removable-medium storage device 515. The computer program is loaded to the RAM 512 or to the secondary storage device 514 from the memory medium M through the removable-medium storage device 515. Alternatively, the computer program may be stored in a remote memory medium (not shown), and is loaded to the RAM 512 or to the secondary storage device 514 from the remote memory medium through the communication apparatus 523 and the interface 516.

Upon user instruction for program execution entered through the keyboard 521 and/or the mouse 522, the CPU 511 loads the program to the RAM 512 from the memory medium M, the remote memory medium, or the secondary storage device 514. The CPU 511 serving as a processor and an arithmetic circuit executes the program loaded to the RAM 512 by use of an available memory space of the RAM 512 as a work area, and continues processing while communicating with the user as such a need arises. The ROM 513 stores therein control programs for the purpose of controlling basic operations of the computer 510.

By executing the computer program as described above, the computer 510 performs the design processes which have heretofore been described.

According to at least one embodiment, the efficient utilization of a limited number of RAMs is enabled in the FPGA-based development and implementation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A design apparatus, comprising:
 a processing unit configured to include a plurality of RAMs within a FPGA block RAM of a FPGA device by arranging the plurality of RAMs in at least one of a word direction and a bit direction of the FPGA block RAM, to generate a description, in a hardware description language, of a control circuit that controls input and output signals of each of the plurality of RAMs so as to allow each of the plurality of RAMs to be accessed as a single RAM, and to lay out a circuit containing the plurality of RAMs and the control circuit on the FPGA device.

2. The design apparatus as claimed in claim 1, wherein the processing unit is further configured to identify signals connected to the plurality of RAMs arranged as single RAMs in a description, in a hardware description language, of a circuit under development that is generated by allocating only a single RAM to each corresponding one of a plurality of FPGA block RAMs, and configured to reconnect the identified signals to the control circuit of the FPGA block RAM.

3. The design apparatus as claimed in claim 1, wherein the control circuit includes an arbitration circuit that allows the plurality of RAMS to be sequentially accessed when access collision is present between the plurality of RAMS.

4. The design apparatus as claimed in claim 1, wherein the control circuit includes an address conversion circuit that converts an address supplied from an external source into an address for accessing the plurality of RAMS.

5. The design apparatus as claimed in claim 1, wherein the control circuit includes a circuit that produces a signal indicative of an accessible RAM among the plurality of RAMs.

6. The design apparatus as claimed in claim 1, wherein with the plurality of RAMs being arranged within the FPGA block RAM in the bit direction thereof, the control circuit includes a circuit configured to read data from the plurality of RAMs arranged in the bit direction, to replace part of the data with write data supplied from an external source, and to write the data with the part thereof being replaced to the plurality of RAMs.

7. A non-transitory computer-readable recording medium having a program embodied therein for causing a computer to perform:
 including a plurality of RAMs within a FPGA block RAM of a FPGA device by arranging the plurality of RAMs in at least one of a word direction and a bit direction of the FPGA block RAM;
 generating a description, in a hardware description language, of a control circuit that controls input and output signals of the plurality of RAMs so as to allow each of the plurality of RAMs to be accessed as a single RAM; and
 laying out a circuit containing the plurality of RAMs and the control circuit on the FPGA device.

8. The non-transitory computer-readable recording medium as claimed in claim 7, wherein the program causes the computer to further perform identifying signals connected to the plurality of RAMs arranged as single RAMs in a description, in a hardware description language, of a circuit under development that is generated by allocating only a single RAM to each corresponding one of a plurality of FPGA block RAMs, and reconnecting the identified signals to the control circuit of the FPGA block RAM.

9. A method of FPGA-based design, the method comprising:
 including a plurality of RAMs within a FPGA block RAM of a FPGA device by arranging the plurality of RAMs in at least one of a word direction and a bit direction of the FPGA block RAM;
 generating a description, in a hardware description language, of a control circuit that controls input and output signals of the plurality of RAMs so as to allow each of the plurality of RAMs to be accessed as a single RAM; and laying out a circuit containing the plurality of RAMs and the control circuit on the FPGA device.

* * * * *